US012181963B2

(12) United States Patent
Tseng et al.

(10) Patent No.: US 12,181,963 B2
(45) Date of Patent: Dec. 31, 2024

(54) ROBUST CIRCUITRY FOR PASSIVE FUNDAMENTAL COMPONENTS

(71) Applicant: Qualcomm Incorporated, San Diego, CA (US)

(72) Inventors: Yi-Hung Tseng, San Diego, CA (US); Marzio Pedrali-Noy, San Diego, CA (US); Charles James Persico, Rancho Santa Fe, CA (US); Mustafa Keskin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 200 days.

(21) Appl. No.: 17/485,092

(22) Filed: Sep. 24, 2021

(65) Prior Publication Data

US 2023/0098996 A1    Mar. 30, 2023

(51) Int. Cl.
| | | |
|---|---|---|
| *G06F 11/00* | (2006.01) | |
| *G06F 11/07* | (2006.01) | |
| *G06F 13/40* | (2006.01) | |
| *H03K 3/037* | (2006.01) | |
| *H03L 7/08* | (2006.01) | |

(52) U.S. Cl.
CPC ...... *G06F 11/0793* (2013.01); *G06F 11/0751* (2013.01); *G06F 13/4022* (2013.01); *H03K 3/037* (2013.01); *H03L 7/08* (2013.01)

(58) Field of Classification Search
CPC ............. G06F 11/0793; G06F 11/0751; G06F 11/1616; G06F 11/18; G06F 11/2002; G06F 11/2017
See application file for complete search history.

(56) References Cited

U.S. PATENT DOCUMENTS

| | | |
|---|---|---|
| 4,751,405 A | 6/1988 | Bufano, Jr. et al. |
| 4,992,755 A | 2/1991 | Seevinck et al. |
| 5,206,541 A | 4/1993 | Boahen et al. |
| 5,408,462 A | 4/1995 | Opoczynski |
| 5,720,004 A | 2/1998 | Li et al. |
| 5,770,954 A | 6/1998 | Tomasini et al. |
| 6,362,662 B1 | 3/2002 | Shi et al. |

(Continued)

FOREIGN PATENT DOCUMENTS

| | | |
|---|---|---|
| JP | 2015208088 A | 11/2015 |
| RU | 2442964 C1 | 2/2012 |

OTHER PUBLICATIONS

International Search Report and Written Opinion—PCT/US2022/075343—ISA/EPO—Jan. 5, 2023, 12 pages.

(Continued)

*Primary Examiner* — Katherine Lin
(74) *Attorney, Agent, or Firm* — Colby Nipper

(57) ABSTRACT

An apparatus is disclosed for making circuitry with passive fundamental components more robust. In example implementations, an apparatus includes at least one passive fundamental component and at least one redundant passive fundamental component. The apparatus also includes fault tolerant circuitry coupled to the at least one passive fundamental component and the at least one redundant passive fundamental component. The fault tolerant circuitry includes fault detection circuitry configured to detect a fault of the at least one passive fundamental component. The fault tolerant circuitry also includes component repair circuitry configured to disconnect the at least one passive fundamental component based on the fault.

31 Claims, 10 Drawing Sheets

(56) References Cited

U.S. PATENT DOCUMENTS

| | | |
|---|---|---|
| 6,421,286 B1 | 7/2002 | Ohtani et al. |
| 6,538,496 B1 | 3/2003 | Tanase |
| 6,625,072 B2 | 9/2003 | Ohtani et al. |
| 6,798,253 B1 | 9/2004 | Shi et al. |
| 6,895,537 B2 | 5/2005 | Kawagoe et al. |
| 7,372,685 B2 | 5/2008 | Beck et al. |
| 7,570,076 B2 | 8/2009 | Marshall et al. |
| 8,362,794 B2 | 1/2013 | Chen et al. |
| 8,619,445 B1 | 12/2013 | Low et al. |
| 8,901,980 B1 | 12/2014 | Naish et al. |
| 8,942,051 B2 | 1/2015 | Adham et al. |
| 9,871,511 B2 | 1/2018 | Forney |
| 10,170,992 B1 | 1/2019 | Omole et al. |
| 10,177,713 B1 | 1/2019 | Far |
| 10,198,022 B1 | 2/2019 | Far |
| 10,277,141 B2 | 4/2019 | Moffat et al. |
| 10,491,167 B1 | 11/2019 | Far |
| 10,560,058 B1 | 2/2020 | Far |
| 11,009,900 B2 | 5/2021 | Ivanov et al. |
| 11,016,732 B1 | 5/2021 | Far |
| 2003/0204226 A1 | 10/2003 | Acosta et al. |
| 2010/0194345 A1 | 8/2010 | Li |
| 2010/0315847 A1 | 12/2010 | Maher |
| 2012/0163074 A1 | 6/2012 | Franca-Neto et al. |
| 2012/0166897 A1 | 6/2012 | Franca-Neto et al. |
| 2014/0211562 A1 | 7/2014 | Chang et al. |
| 2014/0241036 A1 | 8/2014 | Toda |
| 2015/0338931 A1 | 11/2015 | Teh et al. |
| 2017/0187199 A1 | 6/2017 | Wei et al. |
| 2022/0108736 A1 | 4/2022 | Madhavan et al. |
| 2022/0391570 A1 | 12/2022 | Al-Hemyari et al. |
| 2023/0107547 A1 | 4/2023 | Tseng et al. |

OTHER PUBLICATIONS

Ohata T., et al., "Fault Tolerance of Simplified Parallel Power Converters with Current Sharing Function", Circuits and Systems (APCCAS), 2012 IEEE Asia Pacific Conference on, IEEE, Dec. 2, 2012, XP032314848, pp. 104-107.

ROBUST CIRCUITRY FOR PASSIVE FUNDAMENTAL COMPONENTS

TECHNICAL FIELD

This disclosure relates generally to electronic devices with passive fundamental components and, more specifically, to making circuitry with passive fundamental components more fault tolerant.

BACKGROUND

Electronic devices include traditional computing devices such as desktop computers, notebook computers, smartphones, wearable devices like a smartwatch, internet servers, and so forth. However, electronic devices also include other types of computing devices such as personal voice assistants, robotics, automotive electronics, thermostats and other sensors or automated controllers, digital components and devices embedded in other machines like refrigerators and industrial tools, Internet of Things (IoT) devices, and so forth. These various electronic devices provide services relating to productivity, communication, social interaction, security, safety, remote management, entertainment, transportation, and information dissemination. Thus, electronic devices play crucial roles in many aspects of modern society.

Many of the services provided by electronic devices in today's interconnected world depend at least partly on electronic communications. Electronic communications include, for example, those exchanged between two or more electronic devices using wireless or wired signals that are transmitted over one or more networks, such as the Internet, a Wi-Fi® network, or a cellular network. Electronic communications therefore include both wireless and wired transmissions and receptions. To make such electronic communications, an electronic device uses a transceiver, such as a wireless transceiver.

Electronic communications can therefore be realized by propagating signals between two wireless transceivers at two different electronic devices. For example, using a wireless transmitter, a smartphone can transmit a wireless signal to a base station over an air medium as part of an uplink communication to support mobile services. Using a wireless receiver, the smartphone can receive a wireless signal from the base station via the air medium as part of a downlink communication to enable mobile services. With a smartphone, mobile services can include audio and video calls, social media interactions, messaging, watching movies, sharing videos, performing searches, acquiring map information or navigational instructions, finding friends, location-based services generally, transferring money, ordering a good or service like a car ride, and so forth. Other services that can be enhanced with wireless communications include self-driving vehicles, augmented reality (AR) and other mixed reality (MR) imaging, on-the-go 4K video streaming, ubiquitous sensors to keep people safe and to use natural resources more efficiently, real-time language translations, and so forth.

To provide these and other types of services in a wireless environment, electronic devices typically use a wireless interface device to communicate wireless signals via an antenna. The wireless interface device can include, for example, a communication processor, a wireless transceiver, and a radio-frequency (RF) front-end, which interfaces with the antenna. To provide wireless services, especially newer ones that demand higher bandwidth and lower latency, the components of the wireless interface device will be expected to operate efficiently at higher frequencies, with lower power, and/or in rugged applications.

Providing wireless communications and associated services is contingent on an electronic device, including a wireless interface device thereof, operating in accordance with a manufacturer's specifications. If the wireless interface device malfunctions, the electronic device can be rendered nonfunctional, so a user may be inconvenienced or endangered. Manufacturers and retailers also incur costs when nonfunctioning electronic devices are returned by the user.

SUMMARY

As signal frequencies increase and battery concerns lead voltage levels to be reduced, the circuits of electronic devices become more prone to failure. The likelihood of failure increases further as the size of fundamental components is decreased to improve processing performance or lower power usage. Such failures lead to nonfunctioning electronic devices that incur costs. Some fundamental components can eventually fail even if such components passed multiple tests at a manufacturing facility before shipment. Examples of passive fundamental components are capacitors and resistors. To make circuitry with passive fundamental components more robust, this document describes techniques that employ component redundancy and fault tolerant circuitry, including with radio-frequency (RF) components. In some implementations, circuitry includes a passive fundamental component and a redundant passive fundamental component. Upon detecting a fault of the passive fundamental component, the fault tolerant circuitry disconnects the passive fundamental component and connects the redundant passive fundamental component. Fault detection can be based on a voltage level associated with a terminal of the passive fundamental component that is monitored while a current is routed toward the terminal. In these manners, circuitries that include passive fundamental components, including an RF component, can be made more robust.

In an example aspect, an apparatus for robust circuitry with passive fundamental components is disclosed. The apparatus includes at least one passive fundamental component and at least one redundant passive fundamental component. The apparatus also includes fault tolerant circuitry coupled to the at least one passive fundamental component and the at least one redundant passive fundamental component. The fault tolerant circuitry includes fault detection circuitry configured to detect a fault of the at least one passive fundamental component. The fault tolerant circuitry also includes component repair circuitry configured to disconnect the at least one passive fundamental component based on the fault.

In an example aspect, an apparatus for increasing fault tolerance with passive fundamental components is disclosed. The apparatus includes at least one passive fundamental component and at least one redundant passive fundamental component. The apparatus also includes detection means for detecting a fault of the at least one passive fundamental component. The apparatus further includes repair means for repairing the at least one passive fundamental component with the at least one redundant passive fundamental component based on the fault.

In an example aspect, a method for increasing fault tolerance with passive fundamental components is disclosed. The method includes routing current to a terminal of at least one passive fundamental component and detecting, after the routing, a voltage level associated with the terminal. The method also includes producing a voltage value based on the voltage level, with the voltage value indicative of whether the at least one passive fundamental component is faulty. The method additionally includes disconnecting the at least one passive fundamental component based on the voltage value. The method further includes connecting at least one redundant passive fundamental component based on the voltage value.

In an example aspect, an apparatus for robust circuitry with passive fundamental components is disclosed. The apparatus includes at least one radio-frequency component. The at least one radio-frequency component includes an array of passive fundamental components and an array of redundant passive fundamental components. The at least one radio-frequency component also includes fault tolerant circuitry. The fault tolerant circuitry includes multiple switches, with each respective switch of the multiple switches coupled between a node and a terminal. The terminal can be of a respective passive fundamental component of the array of passive fundamental components, or the terminal can be of a respective redundant passive fundamental component of the array of redundant passive fundamental components. The fault tolerant circuitry also includes multiple flip-flops. Each respective flip-flop of the multiple flip-flops is coupled to the terminal of a respective passive fundamental component of the array of passive fundamental components. The fault tolerant circuitry further includes multiple multiplexers. Each respective multiplexer of the multiple multiplexers is coupled between a respective flip-flop of the multiple flip-flops and a respective switch of the multiple switches that are coupled between the node and the terminal of a respective passive fundamental component of the array of passive fundamental components.

BRIEF DESCRIPTION OF DRAWINGS

FIG. 8-1 is a circuit diagram illustrating an example robust circuitry arrangement that includes an array of passive fundamental components and an array of redundant passive fundamental components in an example discarding scheme.

FIG. 8-2 is a circuit diagram illustrating another example robust circuitry arrangement that includes an array of passive fundamental components and redundant passive fundamental components in an example discarding scheme.

DETAILED DESCRIPTION

Figure 1:
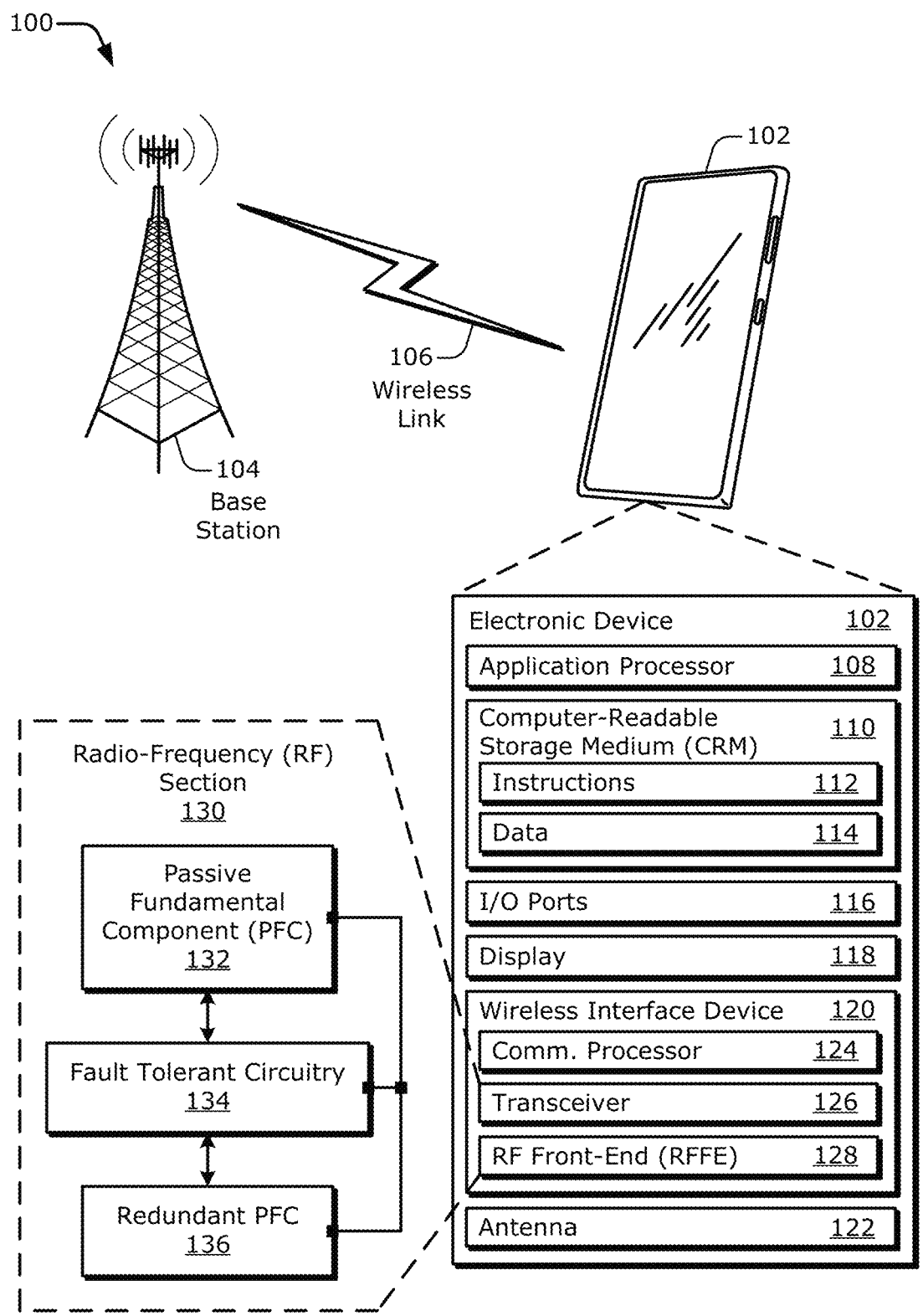
FIG. 1 illustrates an environment depicting an example electronic device having a wireless interface device including a redundant passive fundamental component and fault tolerant circuitry to realize robust circuitry with passive fundamental components.

Manufacturers produce electronic devices in a variety of types and form factors, and such electronic devices can provide a myriad of services in today's modern interconnected society. Electronic devices can include discrete circuit components as well as analog and digital integrated circuits. Integrated circuits can include thousands, millions, or even more fundamental components. Fundamental components can include both active and passive components, such as transistors, diodes, capacitors, resistors, and the like. The circuitry fabricated on an integrated circuit (IC) is carefully designed to perform designated functions under specified conditions to support some feature of the electronic device.

Examples of such features are making wireless communications, presenting images on a display screen, enhancing photos, and so forth. If the conditions vary outside those that are specified, the IC may fail to achieve the designated functionality. The IC can also fail to achieve designated functions if a component does not operate within specified parameters. Specified parameters may include a frequency of operation, an amplification gain, a current magnitude, or a voltage level. Examples of ICs include a general processor, a graphics processor, a system-on-chip (SoC), a modem, a security chip, and at least a portion of a transceiver or radio-frequency (RF) front-end. Each of these types of ICs has particular designated functions that may be important to the operation of an overall electronic device.

In some cases, if a single component, including a single fundamental component, of an IC fails to operate as intended by an IC designer, the entire IC can fail to perform one or more designated functions. Consequently, the failure of a one-thousandth portion or a one-millionth portion of an IC chip can render the entire chip unusable and essentially worthless. This failure incurs at least the cost of the IC chip, and the defective IC chip can also break an electronic device that relies on the correct functioning of the chip.

An example of a circuit part that enables the operation of many circuits is the passive component. A passive component can operate correctly without separately receiving power—e.g., without being placed into some particular state using a flowing current and/or a bias voltage. A passive component can include a capacitor, a resistor, an inductor, etc., or a component formed from multiple instances of such components, like a passive filter. A passive component can comprise a passive fundamental component. Passive fundamental components can include, for example, individual instances of capacitors, resistors, inductors, and diodes. In addition to being part of digital ICs, passive fundamental components can be included in analog integrated circuits. Analog ICs may be employed, for instance, in RF parts of an electronic device. Within a wireless interface device of an electronic device, RF analog ICs can be located in various parts of a transceiver or an RF front-end. Passive fundamental components can also be employed in discrete (e.g., nonintegrated) circuits and mixed circuitries.

With advanced nanometer technologies, the size at which passive fundamental components are being fabricated is smaller than with previous process generations. This size can conflict with the wavelengths of light that are used to fabricate ICs using photolithography. Imperfections in photolithography often cause process defects in silicon, which can lead to circuit failures that may be difficult to identify or predict before the failures occur. For example, process defects can cause capacitors to be shorted and resistors to be open or shorted. Accordingly, passive fundamental components that are deployed at nanometer scales are less likely to operate correctly due to the conflict between photolithographic techniques and smaller component sizes. Further, smaller components, which may be made with nanometer process nodes, are more susceptible to failure when exposed to higher power levels versus larger components that are made on larger process nodes. Components that are deployed in RF parts of an electronic device can be subjected to higher power levels than components that are deployed in parts operating at lower frequencies. For this additional reason, passive RF fundamental components are still more likely to fail when fabricated at nanometer process sizes as compared to older, larger process sizes.

Passive fundamental components are used in many different circuits and "higher-level" components, such as a phase-locked loop (PLL), a power management integrated circuit (PMIC), or a frequency converter. Such circuits employ resistors and capacitors. A capacitor, for instance, can be used as a coupling capacitor or a filter capacitor. Imperfections arising from IC fabrication, like during a photolithography procedure, can cause process defects in the silicon that ultimately produce fragile passive fundamental components. These defects and resulting component faults, which can be difficult to detect with initial factory testing, eventually lead to circuit failure.

Consequently, passive fundamental components, and associated circuitries, can function within target specifications at the beginning of a product's lifetime, but they may eventually fail due to device aging, electrical stress, or unexpected damage. Typical reliability tests (e.g., high-temperature operating life (HTOL) and electrostatic discharge (ESD) tests) are intended to anticipate or capture this type of future failure during manufacturing and quality control, but many passive fundamental components that are destined to fail while in use in the future remain undetected during the testing conducted by the manufacturer. Products having ICs that pass these initial reliability tests can, therefore, still result in dissatisfaction and customer product returns once a passive fundamental component fails during usage. Extending a product's reliable lifetime, in contrast, can increase customer satisfaction and decrease returns.

To extend the reliable operating lifetime of electronic devices, this document describes techniques to increase the operational resiliency of circuits, including those with passive fundamental components. Robust circuitry with passive fundamental components can be realized by incorporating passive-fundamental-component redundancy and fault tolerant circuitry that utilizes the redundancy. In example implementations, a circuit with a passive fundamental component can detect an issue with the passive fundamental component and implement a repair on-the-fly or in the field, including after a product has shipped or is in use by a customer. The circuit can include a passive fundamental component and a redundant passive fundamental component. The fault tolerant circuitry replaces the passive fundamental component with the redundant passive fundamental component if a fault is detected with the passive fundamental component. This circuitry can be employed, for example, in an RF component of a wireless interface device, such as in a wireless transceiver or an RF front-end. For instance, redundant passive fundamental components and associated fault tolerant circuitry can augment or be included as part of a phase-locked loop (PLL) of an RF component.

In other example implementations, an RF component has a circuit that includes a passive fundamental component and a redundant passive fundamental component. The circuit includes fault tolerant circuitry coupled to the passive fundamental component and the redundant passive fundamental component. Fault detection circuitry of the fault tolerant circuitry can route a current toward a terminal of the passive fundamental component. The fault detection circuitry can then monitor a voltage level that is associated with the terminal and is responsive to the current flow. Based on the monitored voltage level, the fault detection circuitry can produce a voltage value. A component replacement circuitry implementation, for example, of component repair circuitry of the fault tolerant circuitry can use one or more switches to disconnect the passive fundamental component from a node and to connect the redundant passive fundamental component to the node based on the voltage value. In circuits with an array of passive fundamental components and an array of redundant passive fundamental components, an encoder can encode multiple voltage values into a component usage vector indicative of which passive fundamental components and which redundant passive fundamental components are to be active during mission mode operation. In some cases, the fault tolerant circuitry can refresh the voltage level to a default level before the current is routed as part of a fault detection operation.

In these manners, robust circuitry with passive fundamental components can combat the likelihood that some circuits having passive fundamental components will fail over time while being operated by a user in the field, even after passing manufacturing-based reliability tests. To do so, an RF component of an electronic device can include redundant circuitry, such as multiple passive fundamental components that can perform a same function in a circuit. Associated fault tolerant circuitry performs a fault detection operation to detect a fault of a passive fundamental component of the multiple passive fundamental components. To address a detected fault, the fault tolerant circuitry can switch out the faulty passive fundamental component and switch in a correctly functioning (redundant) passive fundamental component. By handling faults with redundant circuitry for an RF component, an electronic device can continue to provide wireless communications in a more reliable manner and/or for a longer time period as compared to an electronic device that does not practice the techniques described herein.

FIG. 1 illustrates an environment 100 depicting an example electronic device 102 having a wireless interface device 120. The wireless interface device 120 includes a passive fundamental component 132 (passive fundamental component (PFC) 132), a redundant passive fundamental component 136 (redundant PFC 136), and fault tolerant circuitry 134 to realize robust circuitry with passive fundamental components. In the example environment 100, the electronic device 102 communicates with a base station 104 through a wireless link 106. In FIG. 1, the example electronic device 102 is depicted as a smartphone. However, the electronic device 102 may be implemented as any suitable computing or other electronic device. Examples include a cellular base station, broadband router, access point, cellular or mobile phone, user equipment (UE), gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smartwatch, wireless power device (transmitter or receiver), medical device, and so forth.

The base station 104 communicates with the electronic device 102 via the wireless link 106, which may be implemented as any suitable type of wireless link that carries a wireless communication signal. Although depicted as a base station tower of a cellular radio network, the base station 104 may represent or be implemented as another device, such as a satellite, terrestrial broadcast tower, access point, peer-to-peer device, mesh network node, another electronic device as described above generally, and so forth. Also, although the communication link is depicted as a wireless link 106, the electronic device 102 may communicate with the base station 104 or another device via a wired connection, a wireless connection, or a combination thereof.

The wireless link 106 extends between the electronic device 102 and the base station 104. The wireless link 106 can include a downlink of data or control information communicated from the base station 104 to the electronic device 102, an uplink of other data or control information communicated from the electronic device 102 to the base station 104, or both a downlink and an uplink communication. The wireless link 106 may be implemented using any suitable communication protocol or standard. Examples of such protocols and standards include a 3rd Generation Partnership Project Long-Term Evolution (3GPP LTE) standard, such as a 4th Generation (4G) or a 5th Generation (5G) cellular standard; an IEEE 802.11 standard, such as an 802.11g, ac, ax, ad, aj, or ay standard; an IEEE 802.16 standard (e.g., WiMAX®); a Bluetooth® standard; and so forth. In some implementations, the wireless link 106 may wirelessly provide power instead of or in addition to communication signaling, and the electronic device 102 or the base station 104 may comprise a power source or a power sink.

As shown, the electronic device 102 can include at least one application processor 108 and at least one computer-readable storage medium 110 (CRM 110). The application processor 108 may include any type of processor, such as a central processing unit (CPU) or a multicore or graphics processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, magnetic media (e.g., disk or tape), and so forth. In the context of this disclosure, the CRM 110 is implemented to store instructions 112, data 114, or other information of the electronic device 102, and thus the CRM 110 does not include transitory propagating signals or carrier waves.

The electronic device 102 may also include one or more input/output ports 116 (I/O ports 116) and at least one display 118. The I/O ports 116 enable data exchanges or interaction with other devices, networks, or users. The I/O ports 116 may include serial ports (e.g., universal serial bus (USB®) ports), parallel ports, audio ports, infrared (IR) ports, camera or other sensor ports, and so forth. The display 118 can be realized as a display screen or a projection that presents one or more graphical images provided by the electronic device 102, such as a user interface associated with an operating system, program, or application. Alternatively or additionally, the display 118 may be implemented as a display port or virtual interface through which graphical content of the electronic device 102 is communicated or presented.

The electronic device 102 can further include at least one wireless interface device 120 and at least one antenna 122, which are coupled one to another. The wireless interface device 120 provides connectivity to respective networks and peer devices via a wireless link, which may be configured in a manner that is similar to or different from the wireless link 106. Alternatively or additionally, the electronic device 102 may include a wired interface device, such as an Ethernet or fiber optic transceiver for communicating over a wired local area network (LAN), an intranet, or the Internet. The wireless interface device 120 may facilitate communication over any suitable type of wireless network, such as a wireless LAN (WLAN), wireless personal-area-network (PAN) (WPAN), peer-to-peer (P2P) network, mesh network, cellular network, wireless wide-area-network (WAN) (WWAN), and/or a navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with a cellular network via the base station 104 using the wireless interface device 120. However, the electronic device 102 may also or instead communicate directly with peer devices, an alternative wireless network, and the like using the wireless interface device 120.

As shown, the wireless interface device 120 can include at least one communication processor 124, at least one transceiver 126, and at least one radio-frequency front-end 128 (RFFE 128). The communication processor 124 can be coupled to the transceiver 126, and the transceiver 126 can be coupled to the RF front-end 128, which is coupled to the antenna 122. The communication processor 124 can also be "directly" coupled to the RF front-end 128. These components process data information, control information, and signals associated with communicating information for the electronic device 102 via the antenna 122.

The communication processor 124 may be implemented as part of a system-on-chip (SoC), as a modem baseband processor, or as a baseband radio processor (BBP) that realizes a digital communication interface for data, voice, messaging, or other applications of the electronic device 102. The communication processor 124 can include a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques, including those that are described herein.

Figure 2:
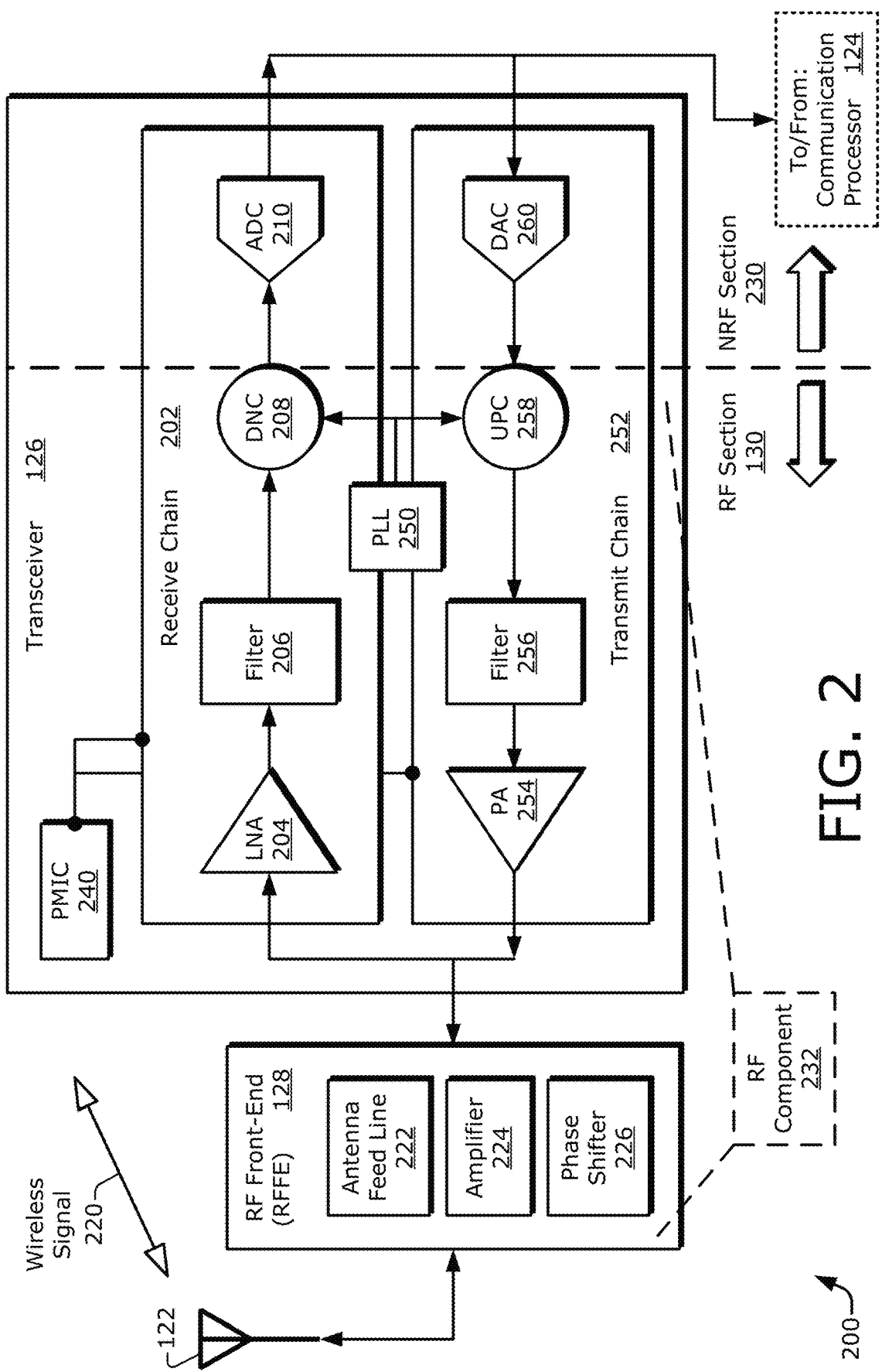
FIG. 2 is a schematic diagram illustrating an example transceiver and an example RF front-end that are separated into an RF section and a non-RF section.

In some cases, the application processor 108 and the communication processor 124 can be combined into one module or integrated circuit (IC), such as an SoC. Regardless, the application processor 108 or the communication processor 124 can be operatively coupled to one or more other components, such as the CRM 110 or the display 118. This operative coupling enables control of, or other interaction with, the other components of the electronic device 102 by at least one processor. Additionally, the communication processor 124 may also include a memory (not separately shown), such as a CRM 110, to store data and processor-executable instructions (e.g., code). The various components that are illustrated in FIG. 1, FIG. 2, and the other drawings using separate schematic blocks may be manufactured or packaged in different discrete manners. For example, one physical module may include components of the RF front-end 128 and some components of the transceiver 126, and another physical module may combine the communication processor 124 with the remaining components of the transceiver 126. Further, the antenna 122 may be co-packaged with at least some components of the RF front-end 128 or the transceiver 126.

The transceiver 126 can include circuitry and logic for filtering, amplification, channelization, and frequency translation. The frequency translation may include an up-conversion or a down-conversion of frequency that is performed in a single conversion operation (e.g., with a direct-conversion architecture) or through multiple conversion operations (e.g., with a superheterodyne architecture) using one or more mixers (not shown). Thus, the transceiver 126 can include filters, switches, amplifiers, mixers, and so forth for routing and conditioning signals that are transmitted or received via the antenna 122. Although not explicitly shown in FIG. 1, the wireless interface device 120 can also include a digital-to-analog converter (DAC) or an analog-to-digital converter (ADC) to convert between analog signals and digital signals. A DAC or an ADC can be implemented as part of the communication processor 124, as part of the transceiver 126, or separately from both of them.

Configurable components of the transceiver 126 may be controlled by the communication processor 124 to implement communications in various modes, with different frequency bands, or to comport with a particular wireless standard. The components or circuitry of the transceiver 126 can be implemented in any suitable fashion, such as with combined transceiver logic or separately as respective transmitter and receiver entities. In some cases, the transceiver 126 is implemented with multiple or different sections to implement respective transmitting and receiving operations (e.g., to implement separate transmit and receive chains). The transceiver 126 may also include logic to perform in-phase/quadrature (I/Q) operations, such as synthesis, phase correction, modulation, demodulation, and the like.

Generally, the RF front-end 128 can include one or more filters, switches, amplifiers, or phase shifters for conditioning signals received via the antenna 122 or for conditioning signals to be transmitted via the antenna 122. The RF front-end 128 may also include other RF sensors and components, such as a peak detector, power meter, gain control block, antenna tuning circuit, diplexer, balun, and the like. Configurable components of the RF front-end 128, such as a phase shifter or mixer, may be controlled by the communication processor 124 to implement communications in various modes, with different frequency bands, or using beamforming. The RF front-end 128 of the wireless interface device 120 is coupled to the antenna 122. The antenna 122 can be implemented as at least one individual antenna, as at least one antenna array that includes multiple antenna elements, or as at least one antenna element of an antenna array. Thus, as used herein, an "antenna" can refer to an individual antenna, an antenna array, or an antenna element of an antenna array, depending on context.

In example implementations, the electronic device 102 includes at least one radio-frequency section 130 (RF section 130). In the RF section 130, at least one signal (e.g., a radio-frequency signal) may be propagated and/or processed at a frequency in the radio range of the electromagnetic spectrum. The radio-frequency range (RF range) of a given device can vary, for example, based on a wireless standard under which the electronic device operates. With a 4G device, for instance, a frequency can range from 600 megahertz (MHz) to 3 gigahertz (GHz), but an RF range is not limited thereto. With a 5G device, a frequency can range from 400 MHz to 6 GHz. Additionally or alternatively, with a 5G device, which is operating in accordance with a different aspect of 5G, a frequency can range from 24 GHz to 60 GHz, but an RF range is not limited to either of these two 5G examples. Generally, a given electronic device, or a wireless interface device thereof, can operate across the RF range as well as in one or more portions thereof and/or in accordance with one or more wireless standards. The RF section 130 can be part of the transceiver 126, part of the RF front-end 128, or part of both the transceiver 126 and the RF front-end 128. As illustrated, the RF section 130 can include at least one passive fundamental component 132 (PFC 132), at least one instance of fault tolerant circuitry 134, and at least one redundant passive fundamental component 136. The fault tolerant circuitry 134 is coupled, directly or indirectly, to the passive fundamental component 132 and the redundant passive fundamental component 136. Each of the passive fundamental component 132 and the redundant passive fundamental component 136 can include, for example, one or more resistors or one or more capacitors (not shown in FIG. 1). Together, at least the redundant passive fundamental component 136 and the fault handler circuitry 134 can form at least part of robust circuitry with passive fundamental components.

In example operations, if the passive fundamental component 132 fails or is failing, the fault tolerant circuitry 134 detects a fault of the passive fundamental component 132 and takes action to remedy (e.g., ameliorate or overcome) the failure to substantially maintain the functionality of the passive fundamental component 132. The fault tolerant circuitry 134 may detect, for instance, that a resistor or capacitor is defective based on a voltage level corresponding to a terminal of the resistor or capacitor. The voltage level may indicate a short-circuit condition or an open-circuit condition of the resistor or capacitor. The fault tolerant circuitry 134 operates to ensure that the circuit using the passive fundamental component 132 can continue to operate within specifications by replacing it with the redundant passive fundamental component 136 based on the voltage level.

By replacing a faulty passive fundamental component with a functioning passive fundamental component, the fault tolerant circuitry 134 can increase the reliability of the radio-frequency section 130 and hence the reliability of an entire IC chip or even a whole electronic device. Although a single instance of each of the passive fundamental component 132, the fault tolerant circuitry 134, and the redundant passive fundamental component 136 are explicitly shown in FIG. 1, the RF section 130 may include more or fewer of such components or circuit parts. Example components that are part of an RF section 130 are described next in relation to an example transceiver 126 and an example RF front-end 128.

FIG. 2 is a schematic diagram 200 illustrating an example transceiver 126 and an example RF front-end 128 that are separated into an RF section 130 and a non-RF (NRF) section 230 (NRF section 230). As illustrated from left to right, the antenna 122 is coupled to the RF front-end 128, and the RF front-end 128 is coupled to the transceiver 126.

The transceiver 126 is coupled to the communication processor 124 (of FIG. 1). The example RF front-end 128 can include at least one antenna feed line 222, at least one amplifier 224, and at least one phase shifter 226. The example transceiver 126 can include at least one receive chain 202, at least one transmit chain 252, and at least one power management integrated circuit 240 (PMIC 240).

Although only one PMIC 240 is shown, an electronic device 102, or a wireless interface device 120 thereof, can include multiple PMICs 240 to support multiple power domains, to provide multiple different supply voltages, to enable redundancy for supplying power, and so forth. Although only one RF front-end 128 and one transceiver 126 are shown, an electronic device 102, or a wireless interface device 120 thereof, can include multiple instances of any or all such components. Also, although only certain components are explicitly depicted in FIG. 2 and are shown coupled together in a particular manner, the RF section 130 and the NRF section 230 may include other non-illustrated components, more or fewer components, differently coupled arrangements of components, and so forth.

In some implementations for a radio-frequency front-end, the RF front-end 128 couples the antenna 122 to the transceiver 126 via the antenna feed line 222. In operation, the antenna feed line 222 propagates a signal between the antenna 122 and the transceiver 126. During or as part of the propagation, the antenna feed line 222 can condition the propagating signal. This enables the RF front-end 128 to couple one or more wireless signals 220 from the antenna 122 to the transceiver 126 as part of a reception operation. The RF front-end 128 also enables a transmission signal to be coupled from the transceiver 126 to the antenna 122 as part of a transmission operation to emanate one or more wireless signals 220. The amplifier 224 may be implemented with, for example, a power amplifier or a low-noise amplifier (LNA). Although not explicitly shown in FIG. 2, an RF front-end 128, or an antenna feed line 222 thereof, may include one or more other components, such as a filter, a power meter, a balun, an N-plexer, and so forth.

In some implementations for a transceiver, the transceiver 126 can include at least one receive chain 202, at least one transmit chain 252, or both at least one receive chain 202 and at least one transmit chain 252. The receive chain 202 includes a low-noise amplifier 204 (LNA 204), a filter 206, a downconverter 208 (DNC 208) for frequency down-conversion, and an ADC 210. The transmit chain 252 includes a power amplifier 254 (PA 254), a filter 256, an upconverter 258 (UPC 258) for frequency up-conversion, and a DAC 260. However, the receive chain 202 or the transmit chain 252 can include other components—such as additional amplifiers or filters, multiple mixers, individual phase-locked loops (PLLs), one or more buffers, or at least one local oscillator—that are electrically coupled anywhere along the depicted receive and transmit chains. For example, the receive chain 202 may include a filter or an amplifier between the DNC 208 and the ADC 210. Similarly, the transmit chain 252 may include a filter or an amplifier between the DAC 260 and the UPC 258.

The illustrated receive chain 202 is coupled between the antenna feed line 222 of the RF front-end 128 and the communication processor 124—e.g., via the low-noise amplifier 204 and the ADC 210, respectively. The illustrated transmit chain 252 is coupled between the antenna feed line 222 and the communication processor 124—e.g., via the power amplifier 254 and the DAC 260, respectively. The transceiver 126 can include at least one phase-locked loop 250 (phase-locked loop 250 (PLL 250)), one PLL for each receive/transmit chain pair, one PLL per receive chain and one PLL per transmit chain, multiple PLLs, and so forth. The illustrated at least one PLL 250 is coupled to the DNC 208 and/or the UPC 258 to provide a stable frequency for a mixer of the DNC 208 to perform frequency down-converting or for a mixer of the UPC 258 to perform frequency upconverting.

As shown for the receive chain 202, the antenna 122 is coupled to the low-noise amplifier 204 via the antenna feed line 222, and the low-noise amplifier 204 is coupled to the filter 206. The filter 206 is coupled to the DNC 208, and the DNC 208 is coupled to the ADC 210. The ADC 210 is in turn coupled to the communication processor 124. As shown for the transmit chain 252, the DAC 260 is coupled to the communication processor 124. The DAC 260 is also coupled to the UPC 258. The UPC 258 is coupled to the filter 256, and the filter 256 is coupled to the power amplifier 254. The power amplifier 254 is coupled to the antenna 122 via the antenna feed line 222. Although only one receive chain 202 and one transmit chain 252 are explicitly shown, an electronic device 102, or a transceiver 126 thereof, can include multiple instances of either or both components.

This document now describes an example signal-receiving operation that includes the receive chain 202 of the transceiver 126. As part of the signal-receiving operation, the antenna 122 receives a wireless signal 220. The antenna 122 can be implemented as an individual antenna, as an antenna array, as an antenna element of an antenna array, and so forth. The antenna 122 provides the wireless signal 220 to the RF front-end 128, and the RF front-end 128 uses at least the antenna feed line 222 to forward the corresponding wired signal in the RF domain to the transceiver 126. Thus, the antenna 122 can provide the wireless signal 220 to the low-noise amplifier 204 of the receive chain 202 after conditioning or other signal manipulation by the antenna feed line 222 or another component of the RF front-end 128. The low-noise amplifier 204 amplifies the manipulated signal to produce an amplified signal. The low-noise amplifier 204 provides the amplified signal to the filter 206. The filter 206 filters (e.g., low-pass filters or bandpass filters) the amplified signal by attenuating some range or ranges of frequencies to produce a filtered signal that has one or more frequency bands attenuated. The filter 206 provides the filtered signal to the DNC 208.

The DNC 208 performs frequency conversion on the RF filtered signal to down-convert from one frequency to a lower frequency, such as from a radio frequency (RF) to an intermediate frequency (IF), from a RF directly to a baseband frequency (BBF), and so forth. The DNC 208 can perform the frequency down-conversion in a single conversion step, or through multiple conversion steps, using at least one PLL 250 that generates a signal having a synthesized frequency. Thus, the DNC 208 accepts the filtered signal from the filter 206 and performs a frequency down-conversion operation on the filtered signal to produce a down-converted signal in the non-RF (NRF) domain.

The DNC 208 provides the down-converted signal to the ADC 210. The ADC 210 converts the analog down-converted signal to a digital signal. The ADC 210 provides the digital signal to the communication processor 124. The communication processor 124 can perform demodulation, decoding, and so forth on the digital signal at baseband frequency to produce a data signal. The communication processor 124 then provides the data signal to other components, such as the application processor 108 (of FIG. 1), for further processing (e.g., for processing at an application level) to display images on a screen, conduct a transaction, and so forth. Generally, a given component may convert between analog signals and digital signals. Thus, the ADC 210 is an example of such a component that converts from analog signals to digital signals. The DAC 260 is an example of such a component that converts from digital signals to analog signals.

As part of an example signal-transmitting operation that includes the transmit chain 252, the DAC 260 accepts a digital signal from the communication processor 124. The DAC 260 converts the digital signal to an analog signal, which is at a baseband frequency (BBF) or an intermediate frequency (IF) in the NRF section 230. The DAC 260 forwards the analog signal to the UPC 258. The UPC 258 accepts the analog signal from the DAC 260 and upconverts the analog signal to a higher frequency, such as an RF frequency, to produce an RF signal. The UPC 258 can produce the RF signal using a signal generated by the PLL 250 that has a synthesized frequency that is derived from a local oscillator (LO) (not shown). The UPC 258 provides the RF signal to the filter 256. The filter 256 filters the RF signal to attenuate one or more frequency ranges and produces a filtered signal, which the filter 256 provides to the power amplifier 254. The power amplifier 254 accepts and amplifies the filtered signal to generate an amplified signal in the RF domain. The power amplifier 254 drives the amplified signal onto the antenna feed line 222 for signal conditioning. After any alternative or additional signal processing in the RF domain, the RF front-end 128 provides the conditioned signal to the antenna 122 for emanation as another wireless signal 220.

Example implementations that are described above include at least two frequency domains as represented by the RF section 130 and the NRF section 230 (or other frequency (OF) section 230). Each depicted component is disposed in a different frequency domain—e.g., on a particular side of a frequency converter. Each frequency converter (e.g., the DNC 208 and the UPC 258) receives a signal and produces a frequency-converted signal to establish or create at least two frequency sections or at least two frequency domains at the input and the output of each frequency converter. Thus, in this example for the transmit chain 252, the filter 256 is on one side of the UPC 258 (e.g., in an RF domain), and the DAC 260 is on the other side of the UPC 258 (e.g., in a NRF domain, like an IF or BBF domain). Similarly, in this example for the receive chain 202, the ADC 210 is on one side of the DNC 208 (e.g., in the NRF domain, like the IF or BBF domain), and the low-noise amplifier 204 is on the other side of the DNC 208 (e.g., in the RF domain).

Thus, the DNC 208 can establish an example demarcation between the RF section 130 and the NRF section 230 for reception-oriented circuitry. In described implementations, the DNC 208 down-converts from RF to some other non-RF, such as IF or BBF. Accordingly, each of the components that are disposed between the antenna 122 and at least part of the DNC 208 can correspond to a radio-frequency component 232 (RF component 232) that may operate at a radio frequency. Similarly, the UPC 258 establishes an example demarcation between the NRF section 230 and the RF section 130 for transmission-related circuitry. In described implementations, the UPC 258 upconverts from some NRF, such as IF or BBF, to a RF. Accordingly, each of the components that are disposed between at least part of the UPC 258 and the antenna 122 can correspond to an RF component 232 that may operate at a radio frequency. For example, an RF component 232 can include a filter 206 or a power amplifier 254. Also, a PMIC 240 that provides power to RF circuitry can correspond to an RF component 232. Further, a PLL 250 that provides a signal having a desired frequency to RF circuitry can correspond to an RF component 232.

This document describes some apparatuses and techniques as being applicable to a passive fundamental component 132 and/or an RF section 130 of a wireless interface device 120. Described implementations, however, can additionally or alternatively be included in other components and/or parts of an electronic device. For example, implementations can be deployed in the NRF section 230 of the wireless interface device 120. Fault tolerant circuitry 134 (and/or an associated passive fundamental component 132 and/or redundant passive fundamental component 136) may, for instance, be included as part of the ADC 210, the DAC 260, the communication processor 124, a BBF component (e.g., a baseband filter or another BBF analog circuit), and so forth. Accordingly, in some cases, the fault tolerant circuitry 134 may be coupled to, and may be monitoring for faults, a NRF component (e.g., may be monitoring a passive fundamental component 132, may be monitoring a redundant passive fundamental component 136, may be switching in a redundant passive fundamental component 132, etc., of the NRF section 230). In some of such cases, the fault tolerant circuitry 134 may be realized using circuitry of FIG. 5 and/or FIG. 7.

Figure 3:
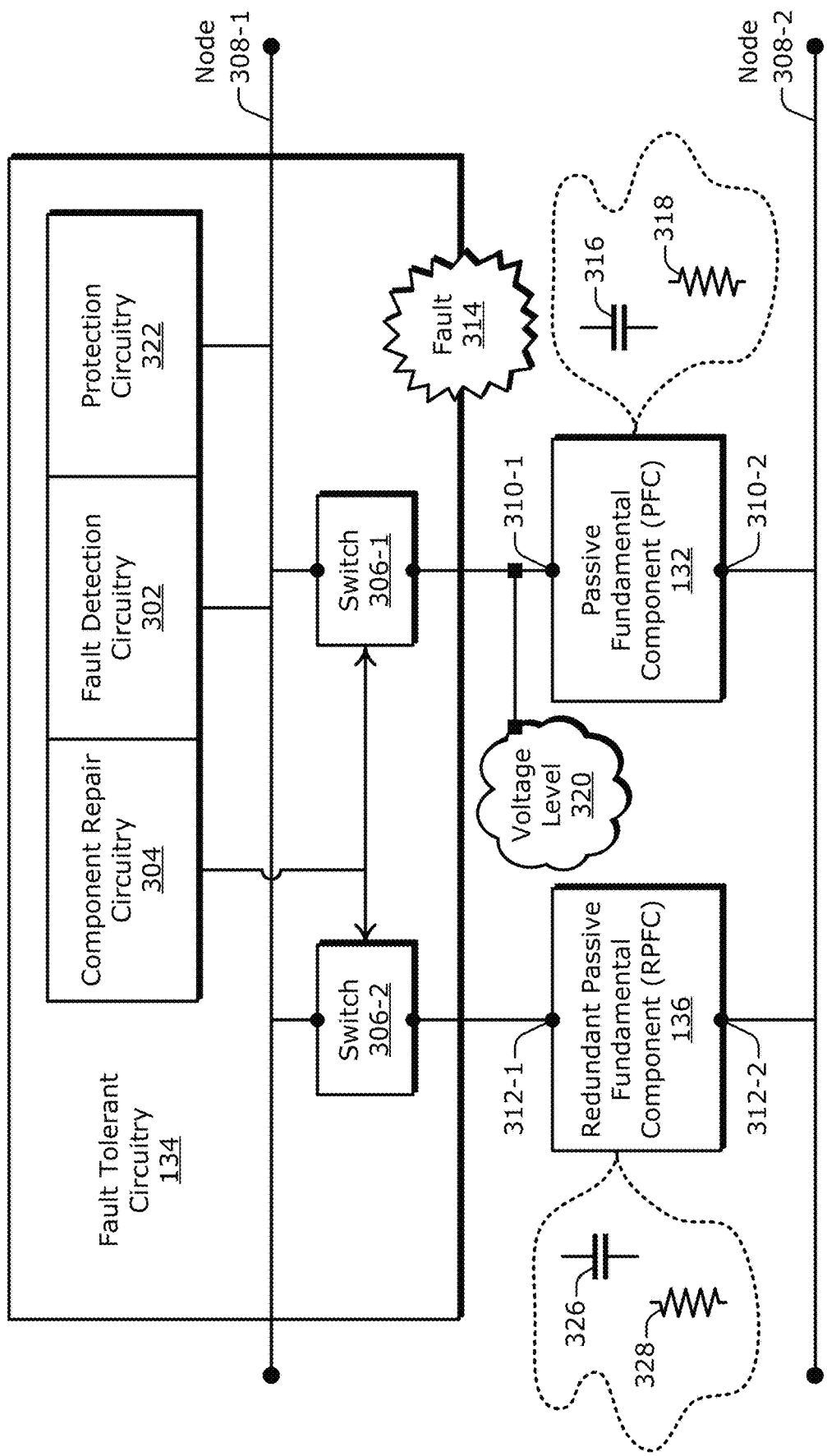
FIG. 3 is a schematic diagram illustrating example fault tolerant circuitry that is coupled to a passive fundamental component and a redundant passive fundamental component.

FIG. 3 is a schematic diagram 300 illustrating part of an apparatus. The schematic diagram 300 depicts example fault tolerant circuitry 134 that is coupled to at least one passive fundamental component 132 (PFC 132) and at least one redundant passive fundamental component 136 (RPFC 136). The fault tolerant circuitry 134 can include fault detection circuitry 302 and component repair circuitry 304. The fault tolerant circuitry 134 can also include multiple switches, such as a first switch 306-1 and a second switch 306-2. Although illustrated separately, the multiple switches may be implemented as part of the fault detection circuitry 302 or the component repair circuitry 304 (including may be implemented as part of both with an inclusive-or interpretation of "or"). Other circuit components (e.g., a transistor, a multiplexer, or a flip-flop as described below) may also be implemented as part of the fault detection circuitry 302 and the component repair circuitry 304. As shown, the schematic diagram 300 can also include multiple nodes, such as a first node 308-1 and a second node 308-2.

The component repair circuitry 304 can be implemented using, for example, component replacement circuitry 304-1 or component discarding circuitry 304-2. Component replacement circuitry 304-1 (e.g., of FIG. 6) can repair a component by replacing a faulty component with a functioning one. For instance, a redundant component can replace a faulty component. Example replacement-based implementations are described herein with reference to FIG. 6. Component discarding circuitry 304-2 (e.g., of FIGS. 8-1 and 8-2) can repair a component by discarding a faulty component. For instance, at least one redundant component, which is already switched into operation, can have sufficient reserve capacity to continue performing some function within targeted specifications. Example discarding implementations are described herein with reference to FIGS. 8-1 and 8-2. However, the various implementations can use some circuitry and techniques in common, such as those described with reference to FIGS. 3, 5, and 7.

In example implementations, the first switch 306-1 is coupled to the passive fundamental component 132, and the second switch 306-2 is coupled to the redundant passive fundamental component 136. The first switch 306-1 can be coupled in series with the passive fundamental component 132 between the first node 308-1 and the second node 308-2, with the passive fundamental component 132 coupled between the second node 308-2 and the first switch 306-1. The second switch 306-2 can be coupled in series with the redundant passive fundamental component 136 between the first node 308-1 and the second node 308-2, with the redundant passive fundamental component 136 coupled between the second node 308-2 and the second switch 306-2. Thus, the series connection of the passive fundamental component 132 and the first switch 306-1 may be coupled in parallel with the series connection of the redundant passive fundamental component 136 and the second switch 306-2 between the first and second nodes 308-1 and 308-2. Each switch 306 may, for example, include or be realized using at least one transistor that can be turned on or off A switch 306 may, for instance, be fabricated from two or more transistors using complementary metal-oxide-semiconductor technology. A given switch 306 may be also or instead be formed using a stack of transistors.

Each fundamental component may include at least one terminal. The passive fundamental component 132 can include at least two terminals: a first terminal 310-1 and a second terminal 310-2. As shown in the example of FIG. 3, the passive fundamental component 132 is coupled to the first switch 306-1 via the first terminal 310-1 and to the second node 308-2 via the second terminal 310-2. The redundant passive fundamental component 136 can also include at least two terminals: a first terminal 312-1 and a second terminal 312-2. As shown, the redundant passive fundamental component 136 is coupled to the second switch 306-2 via the first terminal 312-1 and to the second node 308-2 via the second terminal 312-2.

The passive fundamental component 132 can be implemented with many different types of "unpowered" fundamental components. Examples include the two that are depicted: a capacitor 316 and a resistor 318. Although not depicted, other examples of the passive fundamental component 132 include an inductor and a diode. To provide redundancy, the redundant passive fundamental component 136 can likewise be implemented with any such types of unpowered fundamental components, including a redundant capacitor 326 or a redundant resistor 328, or a redundant inductor (not shown) or a redundant diode (not shown).

In example operations, the fault detection circuitry 302 can detect a fault 314 of the at least one passive fundamental component 132. In some cases, a fault detection operation entails routing current from the fault detection circuitry 302 toward a terminal 310, such as the first terminal 310-1, of the passive fundamental component 132. The fault detection circuitry 302 may route the current through the first switch 306-1. To detect the fault 314, the fault detection circuitry 302 can monitor a voltage level 320 that is associated with the first terminal 310-1 (e.g., a voltage level 320 at a node for the first terminal 310-1). This monitoring is described further below. The voltage level 320 can indicate whether the passive fundamental component 132 is faulty.

The component repair circuitry 304 can disconnect the at least one passive fundamental component 132 and connect the at least one redundant passive fundamental component 136 based on the fault 314. For example, if the fault 314 of the passive fundamental component 132 is detected, the component repair circuitry 304 can disconnect the passive fundamental component 132 from a node, such as the first node 308-1, and connect the redundant passive fundamental component 136 to the node. The connection and disconnection can be accomplished using one or more switches by changing a state of the switch (e.g., from an open state to a closed state, or vice versa). As shown for the series coupling of component and switch, the component repair circuitry 304 can open the first switch 306-1 to disconnect the passive fundamental component 132 and close the second switch 306-2 to connect the redundant passive fundamental component 136.

The passive fundamental component 132 is shown coupled in series with the first switch 306-1, and the redundant passive fundamental component 136 is shown coupled in series with the second switch 306-2. Each switch may, however, be coupled in parallel with a respective fundamental component. If, for instance, a switch 306 is coupled in parallel with a passive fundamental component 132 or a redundant passive fundamental component 136, the switch can be opened to include the fundamental component in a circuit or closed to exclude the functionality of the fundamental component from the circuit. This arrangement is applicable, for example, if the passive fundamental component 132 and the redundant passive fundamental component 136 are coupled together in series with respect to an input node and an output node or with respect to the flow of a signal being processed.

As described above with respect to FIGS. 1 and 2, the principles described herein can be applied to a radio-frequency architecture or to radio-frequency operations. Thus, the at least one passive fundamental component 132 can be realized using at least one radio-frequency component 232 (of FIG. 2). Similarly, the at least one redundant passive fundamental component 136 can be realized using at least one redundant radio-frequency component 232. With continued reference also to FIGS. 1 and 2, an electronic device 102 can include a radio-frequency section 130. Accordingly, the at least one radio-frequency component 232 and the at least one redundant radio-frequency component 232 can be part of the RF section 130.

As described above, passive fundamental components can be implemented with resistors and/or capacitors. Thus, the at least one passive fundamental component 132 can be implemented with at least one resistor 318, and the at least one redundant passive fundamental component 136 can be implemented with at least one redundant resistor 328. Similarly, the at least one passive fundamental component 132 can be implemented with at least one capacitor 316, and the at least one redundant passive fundamental component 136 can be implemented with at least one redundant capacitor 326.

With passive fundamental components, including at least capacitors 316 and resistors 318, the fault 314 may comprise an open-circuit condition. In such cases, the fault detection circuitry 302 can detect the open-circuit condition of the at least one passive fundamental component 132. Additionally or alternatively, the fault 314 may comprise a short-circuit condition. In such cases, the fault detection circuitry 302 can detect the short-circuit condition across the at least one passive fundamental component 132.

In some implementations, the fault tolerant circuitry 134 can also include protection circuitry 322. The protection circuitry 322 can be coupled to the fault detection circuitry 302 to at least alleviate one or more recursive events that are detected by the fault detection circuitry 302. The protection circuitry 322 can include one or more additional circuit elements that are coupled together in parallel and to the first node 308-1. In some cases, the fault detection circuitry 302 can activate the protection circuitry 322 responsive to detection of a fault in at least one passive fundamental component 132. The protection circuitry 322 can include, for example, a controllable clamp or antenna diode to account for a recursive event. For instance, a first diode and a first switch can be coupled together in series between the first node 308-1 and a voltage supply. A second diode and a second switch can be coupled together in series between the first node 308-1 and the voltage supply. The fault detection circuitry 302 can control a state (e.g., open or closed) of one or both of the first and second switches responsive to detection of a defect or another event (e.g., excessive current) that can jeopardize a circuit's ability to function within specifications. The protection circuitry 322 can be used in conjunction with one or more of the other implementations that are described herein, including those corresponding to the circuitries of FIGS. 5-8.

Figure 4:
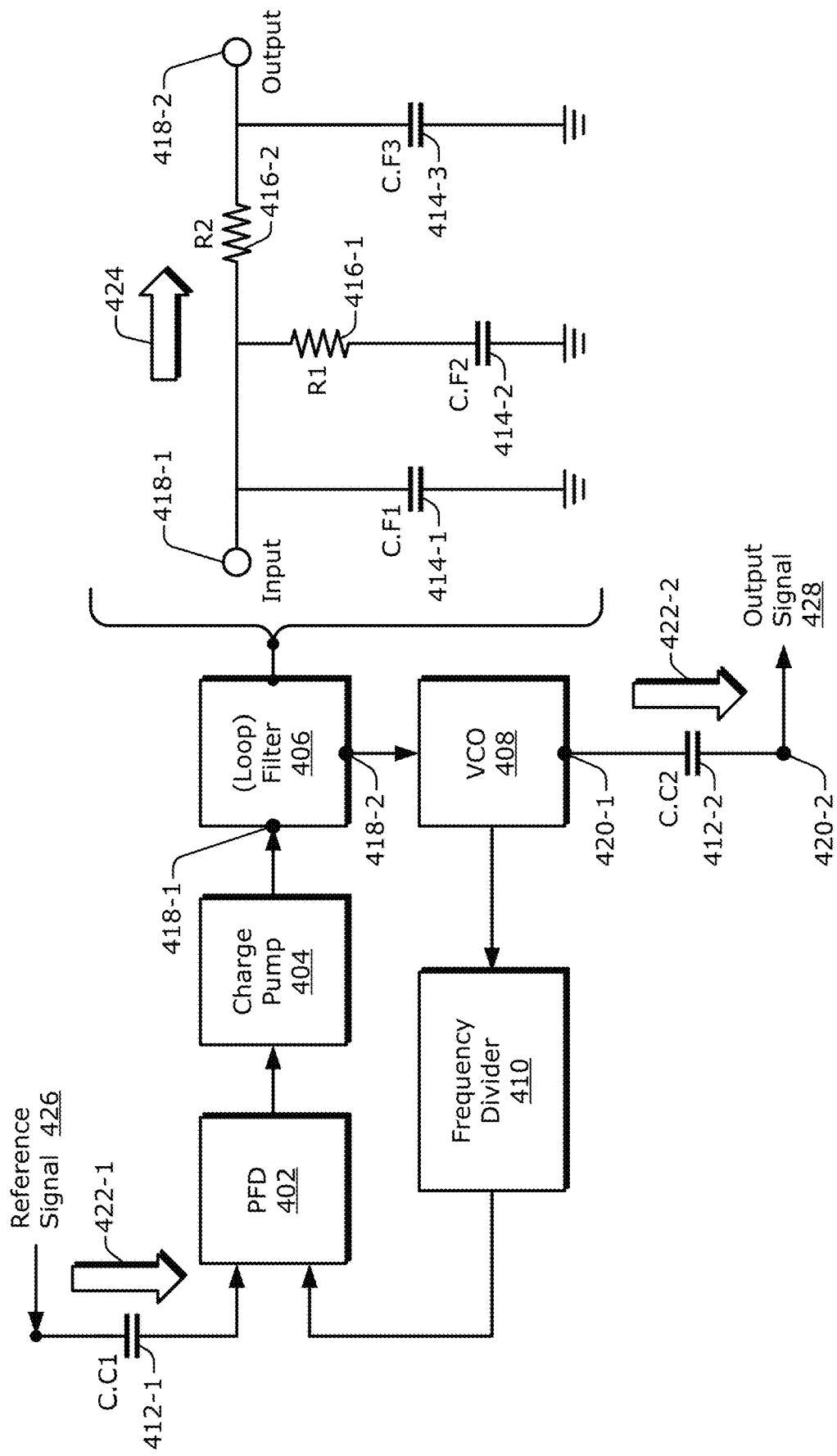
FIG. 4 is a diagram illustrating example implementations of passive fundamental components, including capacitors and resistors, in the context of an example phase-locked loop (PLL).

FIG. 4 is a diagram illustrating example implementations of passive fundamental components, including capacitors and resistors, in the context of an example phase-locked loop (PLL) 250. The PLL 250 is described above with reference to FIG. 2 as being part of the transceiver 126 to provide at least one signal having a radio-frequency for frequency up-conversion by the UPC 258. At least a portion of the PLL 250 may be part of the RF section 130 of FIG. 2. As illustrated in FIG. 4, the example PLL 250 includes a phase-frequency detector 402 (PFD 402), a charge pump 404, a filter 406 (e.g., a loop filter), a voltage-controlled oscillator 408 (VCO 408), and a frequency divider 410. In operation, the PLL 250 accepts a reference signal 426 at the PFD 402 and produces an output signal 428 at the VCO 408.

Two coupling capacitors are coupled to the PLL 250, and they may be part of the PLL 250. A first coupling capacitor 412-1 (C.C1) is coupled to a reference input of the PFD 402 to provide the reference signal 426 to the PFD 402. A second coupling capacitor 412-2 (C.C2) is coupled to an output of the PLL 250 at the VCO 408. The second coupling capacitor 412-2 can provide the output signal 428 to a downstream component, such as the UPC 258 of FIG. 2.

In some implementations, the at least one capacitor 316 (of FIG. 3) can be realized with at least one coupling capacitor 412 (e.g., the first or second coupling capacitor 412-1 or 412-2). Similarly, the at least one redundant capacitor 326 (of FIG. 3) can also be realized with at least one redundant coupling capacitor 412. In implementations with coupling capacitors, a propagating signal may flow through the capacitor from one terminal or plate of the capacitor to another terminal or plate of the capacitor. Signal propagation across the first and second coupling capacitors 412-1 and 412-2 is indicated by propagation arrows 422-1 and 422-2, respectively. Further, with respect to the second coupling capacitor 412-2, the signal propagation arrow 422-2 depicts a signal propagating over or through the second coupling capacitor 412-2 from an input node 420-1 to an output node 420-2.

An example circuit for the filter 406 is also depicted in FIG. 4. The filter 406 includes an input node 418-1 (or input port) and an output node 418-2 (or output port). The filter 406 can include at least one capacitor 414 and at least one resistor 416. In the depicted example third-order filter, the filter 406 includes a first resistor 416-1 (R1) and a second resistor 416-2 (R2). The second resistor 416-2 is coupled between the input and output nodes 418-1 and 418-2. The filter 406 also includes three capacitors: a first filter capacitor 414-1 (C.F1) that is coupled between the input node 418-1 and a ground; a second filter capacitor 414-2 (C.F2) that is coupled between the ground and the first resistor 416-1, which is coupled between the second filter capacitor 414-2 and the input node 418-1; and a third filter capacitor 414-3 (C.F3) that is coupled between the output node 418-2 and the ground.

An example signal propagation for the filter 406 is indicated by a propagation arrow 424, which extends from the input node 418-1 to the output node 418-2. Thus, a signal propagates in a direction through a terminal of, and orthogonal to, the multiple components that are coupled between the ground and an input or an output node 418-1 or 418-2, such as the first filter capacitor 414-1. The signal also propagates in a direction through two terminals of, and parallel to, the second resistor 416-2. In some implementations, the at least one capacitor 316 (of FIG. 3) can be realized with at least one filter capacitor 414 (e.g., any of the first, second, or third filter capacitors 414-1, 414-2, or 414-3). Similarly, the at least one redundant capacitor 326 (of FIG. 3) can also be realized with at least one redundant filter capacitor 414. For example, to implement robust circuitry with passive fundamental components, the first filter capacitor 414-1 can be realized with two filter capacitors that are coupled in parallel with each other and with one capacitor being redundant. If the "primary" capacitor fails, the redundant capacitor can be switched into operation between the input node 418-1 and the ground while the primary capacitor is disconnected.

Generally, a phase-locked loop (PLL) 250 can include at least one passive fundamental component 132 and at least one redundant passive fundamental component 136, along with fault tolerant circuitry 134, to provide increased fault tolerance with passive fundamental components. As shown in FIG. 4 and described above, such passive fundamental components can include resistors and capacitors, including coupling capacitors and filter capacitors. Further, a propagating signal can be coupled to one of these components so as to flow through the component or so as to flow orthogonally to the component between an input node and an output node. For example, the PLL 250 can propagate an alternating current (AC) signal through a node 418-1, 418-2, 420-1, or 420-2. Passive fundamental components may, however, be implemented differently and/or located in other circuits of an electronic device, including other circuits of a radio-frequency section 130 of a wireless interface device 120. Other example circuits and environments include a power management integrated circuit, an amplifier, a filter, a power meter, other coupling capacitors, and so forth.

Figure 5:
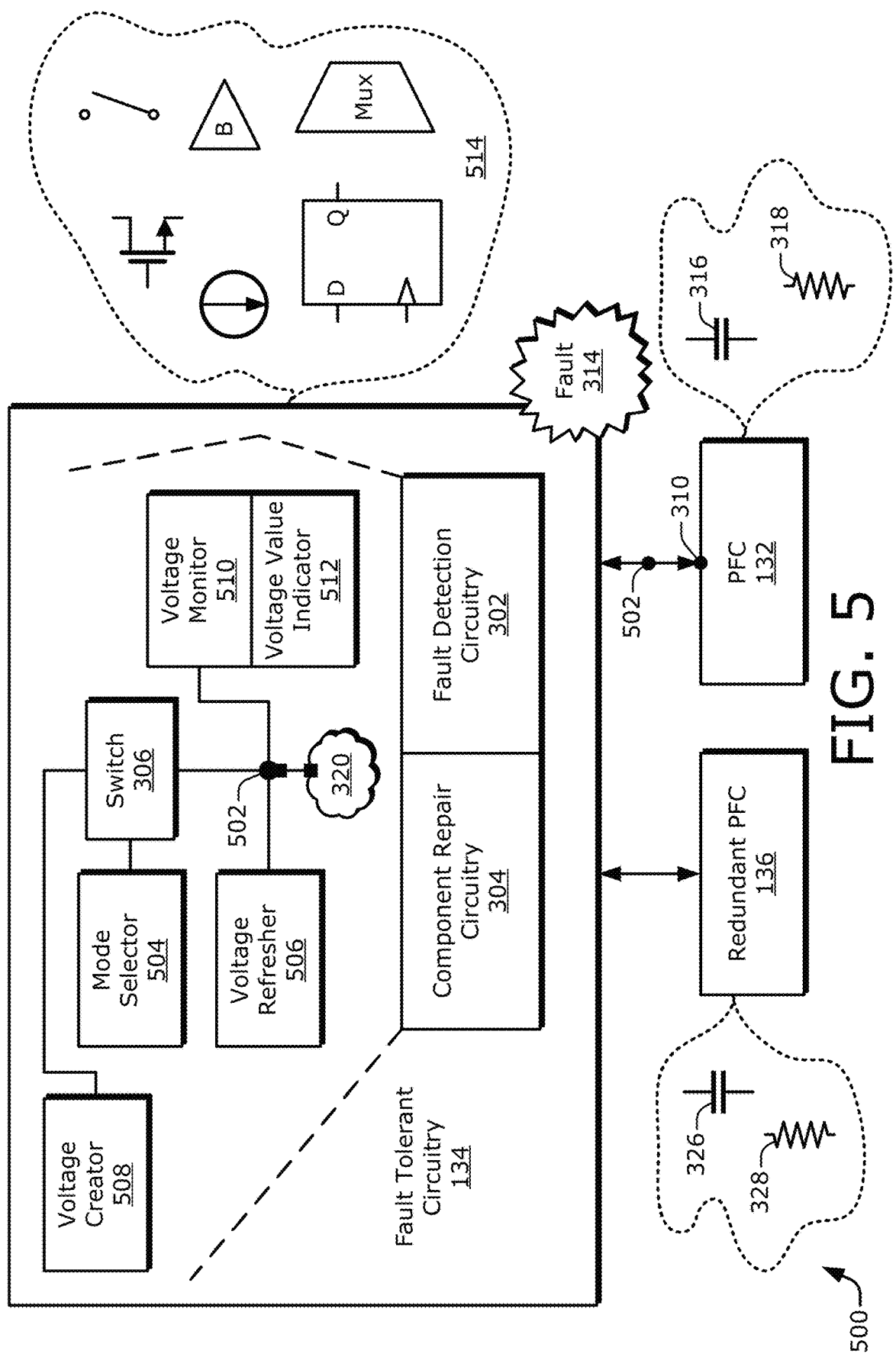
FIG. 5 is a schematic diagram illustrating other example fault tolerant circuitry that is coupled to a passive fundamental component and a redundant passive fundamental component.

FIG. 5 is a schematic diagram 500 illustrating other aspects of example fault tolerant circuitry 134 that is coupled to a passive fundamental component 132 (PFC 132) and a redundant passive fundamental component 136. The schematic diagram 500 depicts example implementations for the fault detection circuitry 302 and the component repair circuitry 304. As shown, the fault tolerant circuitry 134 can include at least one mode selector 504, at least one voltage refresher 506, at least one voltage creator 508, at least one voltage monitor 510, and at least one voltage value indictor 512.

These components and the at least one switch 306 can be coupled to a node 502, which is also coupled to the passive fundamental component 132 via the terminal 310. The node 502 can be associated with a voltage level 320. These components may be realized with one or more circuit elements. Examples of such circuit elements are depicted at 514, and these examples include a switch, a transistor, a current source, a buffer, a flip-flop (e.g., a DQ flip-flop), and a multiplexer (Mux). Example circuit-level implementations using such elements are described below with reference to FIG. 7.

The fault tolerant circuitry 134 can operate in multiple modes—e.g., a fault detection mode and a mission mode. The mode selector 504 is coupled to the switch 306 and can select which mode is currently in effect using the switch 306.

During the fault detection mode, the fault tolerant circuitry 134 performs a fault detection operation on the passive fundamental component 132. The mode selector 504 can be implemented with a multiplexer, which establishes a state of the switch 306 based on whether the passive fundamental component 132 is to be currently used for the mission mode or is currently selected for testing. The mode selector 504 can operate responsive to three signals: an enable detection signal that determines which mode is in effect, a testing selection signal for the fault detection mode, and a data-out indication signal for the mission mode.

To prepare the node 502 for a fault detection operation, the voltage refresher 506 refreshes the voltage level 320. For example, the voltage refresher 506 can cause the voltage level 320 to revert to a default voltage level, such as a supply voltage or a ground. The voltage refresher 506 can be implemented with a transistor that selectively or temporarily couples the node 502 to a power distribution node. Each power distribution node can correspond to, or be realized using, a voltage rail or a ground. The voltage rail or the ground may be realized, for example, with a node, a conductive line, a plane, etc., that is held at some voltage level, such as a supply voltage (V.dd) or a local or global equipotential ground.

To measure a response of the passive fundamental component 132, the voltage creator 508 attempts to establish a particular voltage level 320 at the node 502. The voltage creator 508 can, for example, route current toward a terminal 310 of the passive fundamental component 132 and to the node 502 in an attempt to change the voltage level 320 away from the default voltage level established by the voltage refresher 506. The voltage creator 508 can provide the current using a transistor or a current source (including both in some cases). The current may interact with the passive fundamental component 132 differently depending on whether the passive fundamental component 132 is operating as expected or has a fault 314. For instance, if a short-circuit condition is present across the passive fundamental component 132, routing the current to the node 502 may fail to increase the voltage level 320 as expected for a capacitor 316 or a resistor 318.

The voltage monitor 510 can monitor the voltage level 320 to detect if the voltage level 320 changes due to the current flow as compared to the refreshed voltage established by the voltage refresher 506. Whether the voltage level 320 changes can be reflected by the voltage value indicator 512. Accordingly, the voltage value indicator 512 can hold a voltage value indicative of whether the passive fundamental component 132 is functioning (e.g., within specifications) or has a fault 314. The voltage monitor 510 and the voltage value indicator 512 can be implemented separately or jointly. If implemented jointly, they can be implanted using a flip-flop, such as a DQ flip-flop, that holds a voltage value at the output thereof based on voltage level applied to a clocking input. A circuit-level description of the fault tolerant circuitry 134 is described further below with reference to FIG. 7. Next, however, a switching arrangement is described for an array of passive fundamental components and an array of redundant passive fundamental components.

Figure 6:
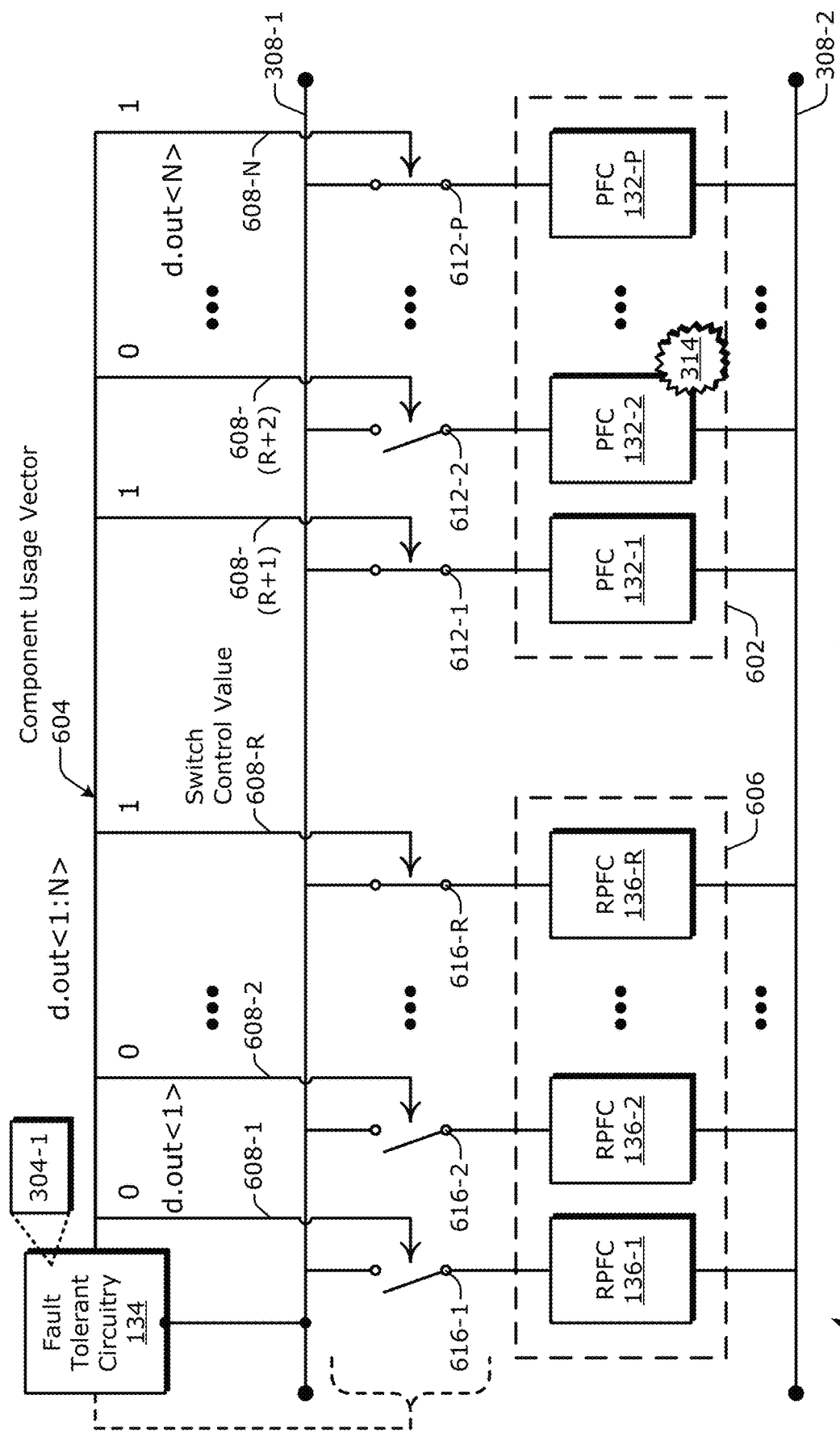
FIG. 6 is a circuit diagram illustrating an example robust circuitry arrangement that includes an array of passive fundamental components and an array of redundant passive fundamental components in an example replacement scheme.

FIG. 6 is a circuit diagram 600 illustrating an example robust circuitry arrangement that includes an array of passive fundamental components 602 and an array of redundant passive fundamental components 606 in an example replacement scheme. In some environments, a circuit may include multiple fundamental components to achieve a given function, such as multiple passive fundamental components coupled together in parallel for a filter. In example implementations, the array 602 includes multiple passive fundamental components 132-1 . . . 132-P, with "P" representing a positive integer greater than one. More specifically, the array of passive fundamental components 602 can include a first passive fundamental component 132-1, a second passive fundamental component 132-2, . . . , a "Pth" passive fundamental component 132-P. The array 606 includes multiple redundant passive fundamental components 136-1 . . . 136-R, with "R" representing a positive integer of two or more. More specifically, the array of redundant passive fundamental components 606 can include a first redundant passive fundamental component 136-1, a second redundant passive fundamental component 136-2, . . . , an "Rth" redundant passive fundamental component 136-R.

In some cases, there may be a one-to-one correspondence between the multiple passive fundamental components 132-1 . . . 132-P and the multiple redundant passive fundamental component 136-1 . . . 136-R. In such cases, "R" may equal "P." In other cases, "R" may be less than "P," like if a 50-unit component and a 100-unit component (e.g., a 50-ohm component and a 100-ohm component) are reserved to replace a 50-unit, a 100-unit, or a 150-unit component (e.g., a 50-ohm, a 100-ohm, or a 150-ohm component). Here, P=3, and R=2. As another example, a set of 10 passive fundamental components may be associated with one or two redundant passive fundamental components because this enables recovery from a 10-20% failure rate. Here, P=10, and R=1 or 2. In still other cases, "R" may be greater than "P," such as if double redundancy for a component is desired.

As shown, the fault tolerant circuitry 134, which can include component replacement circuitry 304-1, also includes a first array of switches 612-1, 612-2, . . . , 612-P and a second array of switches 616-1, 616-2, . . . , 616-R. These switches can correspond to the multiple switches 306-1 and 306-2 of FIG. 3. A respective switch 612 of the multiple switches 612-1 . . . 612-P is coupled to a respective passive fundamental component 132 of the multiple passive fundamental components 132-1 . . . 132-P. Each respective switch 612 selectively or switchably couples the respective passive fundamental component 132 to a node, which is the first node 308-1 in this example. A respective switch 616 of the multiple switches 616-1 . . . 616-R is coupled to a respective redundant passive fundamental component 136 of the multiple redundant passive fundamental components 136-1 . . . 136-R. Each respective switch 616 selectively or switchably couples the respective redundant passive fundamental component 136 to the node, which is the first node 308-1 here. Although depicted as a single switch in each respective column for each respective passive fundamental component 132 or redundant passive fundamental component 136, each column can include multiple switches (e.g., multiple instances of a switch 612 or a switch 616) that are coupled together in series and/or in parallel in each respective column, such as for protection purposes.

In an example scenario, the fault tolerant circuitry 134 determines that the second passive fundamental component 132-2 has a fault 314. To ameliorate if not fully remedy the fault 314, the fault tolerant circuitry 134 opens a switch 612-2 that is coupled to the passive fundamental component 132-2 and closes another switch 616-R that is coupled to the redundant passive fundamental component 136-R based on the fault 314. Thus, the fault tolerant circuitry 134 opens the switch 612-2 to disconnect the passive fundamental component 132-2 from the node 308-1 and closes the other switch 616-R to connect the redundant passive fundamental component 136-R to the node 308-1. In this scenario, the passive fundamental component 132-2 can have a parameter value (e.g., a capacitance value or a resistance value), and the redundant passive fundamental component 136-R can have another parameter value that is substantially equal to the parameter value of the passive fundamental component 132-2. In this context, substantially equal parameter values can include those parameter values that are within 10% of each other, like within 5% of each other.

To control respective states of respective switches of multiple switches, the fault tolerant circuitry 134 can generate a component usage vector 604. The component usage vector 604 has "N" multiple switch control values 608-1, 608-2, . . . , 608-R, 608(R+1), 608(R+2), . . . , 608-N to control the states of the multiple switches 616-1 . . . 616-R and 612-1 . . . 612-P. Accordingly, the value of "N" may equal the sum of "P" and "R" (N=P+R). The switch control values 608-1 . . . 608-N are depicted in FIG. 6 as "d.out<1: N>" because the switches that are selected to be closed during the mission mode are coupled to those fundamental components that affect the data being used and/or being output. Continuing with the example scenario set forth above, the switch control values 608-1 . . . 608-R have values (e.g., voltages) to produce open switch states for each redundant passive fundamental component 136 of the array 606 except for the "Rth" switch control value 608-R, which is for the "Rth" redundant passive fundamental component 136-R. The switch control values 608-(R+1) . . . 608-N, on the other hand, have values (e.g., voltages) to produce closed states for each passive fundamental component 132 of the array 602 except for the "(R+2)th" switch control value 608-(R+2), which is coupled to the second passive fundamental component 132-2.

Figure 7:
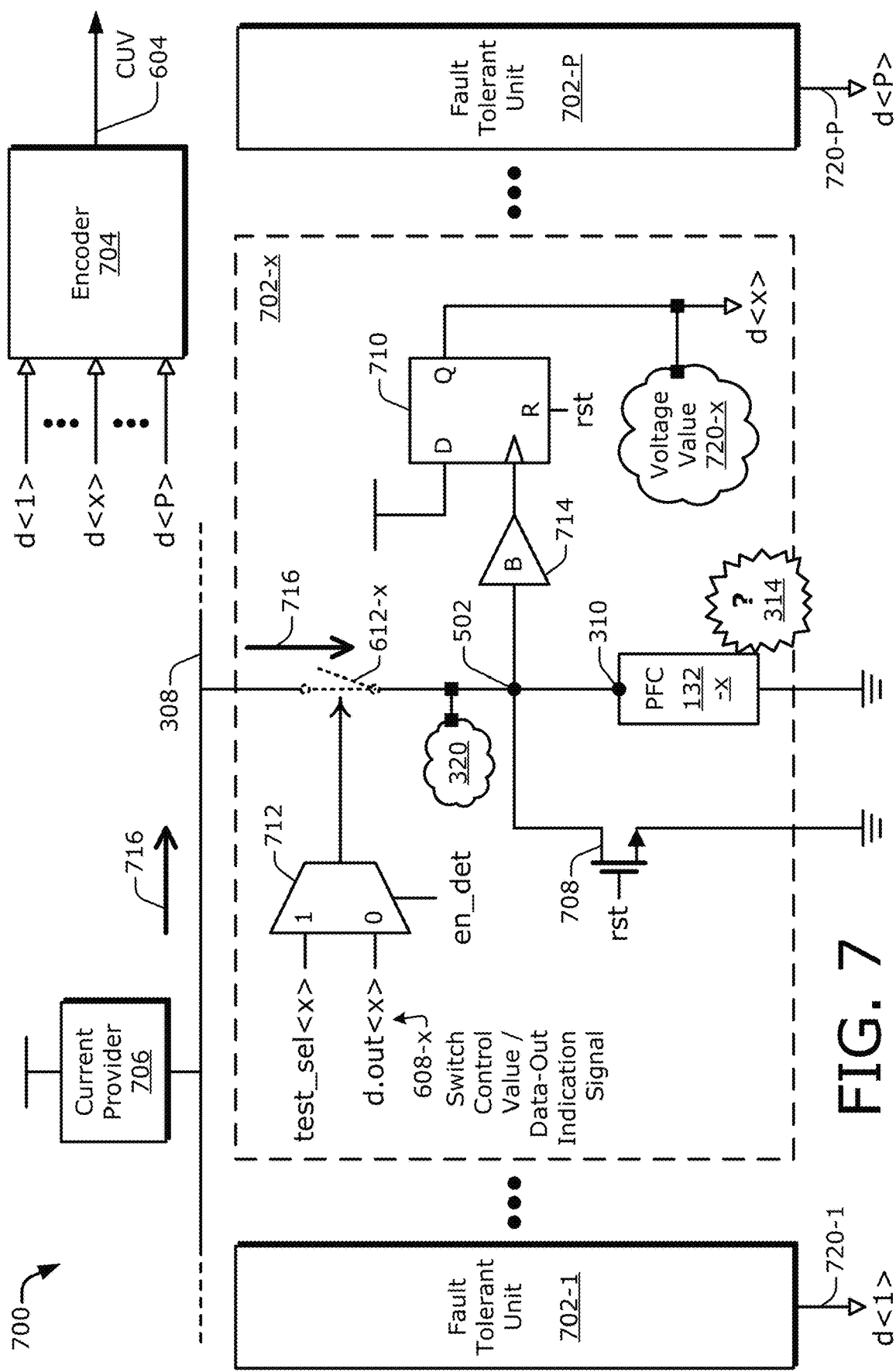
FIG. 7 is a circuit diagram illustrating an example robust circuitry arrangement that includes a transistor, a switch, and a flip-flop that are coupled to a terminal of each passive fundamental component of an array or passive fundamental components.

FIG. 7 is a diagram 700 illustrating an example robust circuitry arrangement for detecting whether a passive fundamental component 132 has a fault 314. As shown, the diagram 700 includes an encoder 704 and a current provider 706. The diagram 700 also includes multiple fault tolerant units 702-1, . . . , 702-x, . . . , 702-P, with each respective fault tolerant unit 702 including a respective passive fundamental component 132. Each fault tolerant unit 702 can include multiple circuit elements as represented by the example fault tolerant unit 702-x.

In example implementations, the fault tolerant unit 702-x includes a transistor 708, a switch 612-x, a flip-flop 710, a multiplexer 712, and a buffer 714. These components are coupled to a terminal 310 of the passive fundamental component 132 of an array or passive fundamental components 602 (of FIG. 6). The current provider 706 is coupled between a power distribution node (e.g., a voltage supply rail as shown) and the node 308 and thus between the voltage supply rail and the switch 612-x. The current provider 706 can implement at least part of the voltage creator 508 (of FIG. 5). The switch 612-x is coupled between the node 308 and the node 502. The multiplexer 712 is coupled to the switch 612-x to control an open or closed state thereof.

The passive fundamental component 132 is coupled between the node 502 (e.g., via the terminal 310) and a power distribution node (e.g., the ground as shown). The buffer 714 is coupled between the node 502 and the flip-flop 710. The flip-flop 710 may be implemented as, for instance, a DQ flip-flop. The DQ flip-flop includes a clocking input (">"), a "D" input, a "Q" output, and a reset input or reset terminal ("R"). An input of the buffer 714 is coupled to the node 502, and an output of the buffer 714 is coupled to the clocking input of the flip-flop 710. The reset terminal "R" is coupled to a reset signal ("rst"). The "D" input is coupled to a power distribution node (e.g., the voltage supply rail as shown). The "Q" output provides a voltage value 720. The output voltage of the flip-flop 710 can indicate a fault status of the passive fundamental component 132. This fault status (e.g., functional or faulty) is depicted in FIG. 7 as "d<x>" with the voltage value 720-x for the fault tolerant unit 702-x. As described below, this fault status "d<x>" can be forwarded to the encoder 704.

The transistor 708 is coupled between the node 502 and another power distribution node (e.g., the ground node as shown). The transistor 708 is depicted, by way of example only, as an n-type field-effect transistor (FET). Accordingly, the source terminal is coupled to ground, and the drain terminal is coupled to the node 502. The gate terminal of the transistor 708 is coupled to the reset signal ("rst"). Generally, a transistor can include multiple terminals, such as three terminals: a first terminal, a second terminal, and a third terminal. Each transistor can include at least one control terminal and two or more channel terminals. A current can flow between a first channel terminal and a second channel terminal of a transistor based on a control signal or bias signal applied to the control terminal.

Although the transistor 708 is depicted as an FET, the transistors described herein can be implemented using any transistor type. Example transistor types include a field-effect transistor (FET), a junction FET (JFET), a bipolar junction transistor (BJT), an insulated-gate bipolar transistor (IGBT), and so forth. Manufacturers may fabricate FETs as n-channel or p-channel transistor types. An FET may be realized as, for example, an n-channel metal-oxide-semiconductor (NMOS) FET (NMOSFET) or a p-channel metal-oxide-semiconductor (PMOS) FET (PMOSFET). Manufacturers may fabricate BJTs as, for example, NPN or PNP transistors. For a BJT, the control terminal may be implemented as a base terminal, and the two channel terminals may be implemented as an emitter terminal and a collector terminal. For an FET, the control terminal may be implemented as a gate terminal, and the two channel terminals may be implemented as a source terminal and a drain terminal.

Although a channel terminal of the transistor 708 is depicted as being "directly" coupled to the power distribution node (e.g., the ground) and the node 502 in FIG. 7, one or more other components (e.g., a resistor or another transistor) may be disposed in between a channel terminal and a node. Generally, this is applicable to the other depicted components, for other circuit elements may be added to the circuit and/or coupled between the depicted components. Additionally, components for the fault tolerant units, as well as other aspects of the fault tolerant circuitry 134, may be realized with different components, more or fewer components, differently arranged or coupled components, and so forth.

In example operations, the fault tolerant circuitry 134 (e.g., which may be distributed across one or more of multiple components, such as the switch 612, the encoder 704, the current provider 706, the transistor 708, the flip-flop 710, or the multiplexer 712, as well as other logic as shown in FIG. 5) initializes the fault tolerant unit 702-x with the reset signal ("rst") to prepare for a fault detection operation. The reset signal "rst" is coupled to the control terminal (e.g., the gate terminal) of the transistor 708 and to the reset terminal of the flip-flop 710. A high voltage, for instance, of the reset signal causes the transistor 708 to turn on and refresh the voltage level 320 to a default value (e.g., ground or zero volts here). The high-voltage reset signal also resets to a low value or zero volts the output voltage value 720-x of the "Q" output of the flip-flop 710. Thus, the output "d<x>" of the fault tolerant unit 702-x starts at zero for the fault detection operation.

The fault tolerant circuitry 134 also establishes the fault detection mode for the particular passive fundamental component 132-x of the "xth" fault tolerant unit 702-x using an enable detection signal ("en_det"). The enable detection signal is coupled to a control input of the multiplexer 712. The multiplexer 712 also includes multiple inputs and an output. The output of the multiplexer 712 controls the state of the switch 612-x. A first input of the multiplexer 712 receives a testing selection signal ("test_sel<x>") so that each passive fundamental component 132 may be tested separately or individually from other ones. The second input receives a switch control value 608-x (or a data-out indication signal 608-x) that is depicted as "d.out<x>" to indicate whether the passive fundamental component 132-x is to be used in the mission mode. Responsive to the enable detection signal "en_det" being high or "1," the multiplexer 712 applies the test selection signal "test_sel<x>" to the switch 612-x to close the switch 612-x for the fault detection operation.

After the voltage level 320 is refreshed by the transistor 708 and the switch 612-x is closed, the current provider 706 produces a current 716 or routes the current 716 to the node 502 and at least toward the terminal 310 of the passive fundamental component 132. The current provider 706 may be realized in different manners. For example, to detect a short-circuit condition of a capacitor (e.g., a shunt across a capacitor 316 implementation of the passive fundamental component 132-x), the current provider 706 can be realized using a transistor (e.g., a MOSFET) that is biased in the triode region to provide a weak pull up. An "on" resistance of this MOSFET can be set to be greater than an expected resistance of a shunt across the capacitor plates. Alternatively, to detect a short-circuit or open-circuit condition of a resistor (e.g., a fault of a resistor 318 implementation of the passive fundamental component 132-x), the current provider 706 can be realized using a current source. A resistance of the current source can be set to provide a pull-up current based on an expected resistance value of a shunt or an open-circuit of the resistor 318.

For a capacitor 316 (of FIG. 3) implementation of the passive fundamental component 132-x, the current 716 accumulates charge at the terminal 310 (and hence the node 502) if the capacitor is not faulty. Thus, the voltage level 320 increases until the clocking input (">") of the flip-flop 710 is triggered through the buffer 714. The triggered clocking input causes the high voltage at the "D" input to be transferred to the "Q" output. The voltage value 720-x that is indicative of whether the passive fundamental component 132-x has a fault becomes a high voltage—which signifies that the passive fundamental component 132-x is not faulty in this case. The voltage value 720-x is provided to the encoder 704 as "d<x>." On the other hand, if the capacitor 316 has a fault 314, the voltage level 320 does not increase, and the clocking input of the flip-flop 710 is not triggered. With a faulty capacitor 316, the voltage that is reset to a logical low value or zero volts for the voltage value 720-x is unchanged.

To test for a short-circuit condition with a resistor 318 implementation of the passive fundamental component 132-x, the current 716 flows to the terminal 310 and then through a resistance if the resistor 318 does not have a short. This resistance in conjunction with the flow of the current 716 creates a voltage drop or differential across the resistor 318. The voltage level 320 therefore increases from ground to a level that triggers the clocking input of the flip-flop 710. With a resistor 318 that does not have a short-circuit fault, operation of the flip-flop 710 is then analogous to that described above for a non-faulty capacitor.

To test for an open-circuit condition with the resistor 318 implementation of the passive fundamental component 132-x, the flip-flop 710 can be modified as an "inverted" flip-flop. In this modified circuit, the "Q" output of the flip-flop is substituted with an inverted output, or a "Qb" or "Q_bar" output. The voltage value 720-x is therefore initialized to a high voltage or a logical one value responsive to the reset signal "rst" being asserted. This output value remains the same unless the clocking input is triggered. If there is an open-circuit condition for the resistor 318, the triggered clocking input of the flip-flop 710 causes the inverted "D" input to be transferred to the "Qb" output, which converts the voltage value 720-x to a low voltage or a zero logical value, signifying that the resistor 318 has an open-circuit fault.

Each respective voltage value 720 of multiple voltage values 720-1 . . . 720-x . . . 720-P from a respective fault tolerant unit 702 of the multiple fault tolerant units 702-1 . . . 702-x . . . 702-P is provided to the encoder 704 as a respective fault indication "d<_>" of multiple fault indications d<1> . . . d<x> . . . d<P>. This fault indication signal has voltage values 720-1 . . . 720-P indicating whether each corresponding passive fundamental component 132 is considered functional or is determined to have a fault 314. The encoder 704 encodes the multiple voltage values 720-1 . . . 720-P into a component usage vector 604 (CUV 604). The encoder 704 includes a mapping of the multiple voltage values 720-1 . . . 720-P to the component usage vector 604. The component usage vector 604 includes "N" d.out<1:N> switch control values 608-1 . . . 608-N as shown in FIG. 6 (or data-out indication signals 608-1 to 608-N as also shown implicitly in FIG. 7). Each switch control value 608 controls whether a corresponding fundamental component (e.g., a passive fundamental component 132 or a redundant passive fundamental component 136) is activated for mission mode operation.

The encoder 704 is programmed to map a faulty passive fundamental component 132 to an open state for a switch 612 corresponding thereto and to a closed state for a switch 616 corresponding to at least one redundant passive fundamental component 136 that can replace the faulty passive fundamental component 132. In some cases, the circuit elements shown in the fault tolerant unit 702-x for the corresponding passive fundamental component 132-x are reproduced in each fault tolerant unit 702 for the corresponding passive fundamental component 132. Accordingly, the fault tolerant circuitry 134 can include multiple multiplexers, multiple flip-flops, and so forth across the multiple fault tolerant units 702-1 . . . 702-P. This enables each fault tolerant unit 702 to produce a voltage value 720 that the encoder 704 can use to produce the data-out indication signals.

With reference to FIGS. 3 and 6, in some cases, the first node 308-1 may be on a supply voltage side or otherwise correspond to a voltage supply, and the second node 308-2 may be on a ground side or otherwise correspond to a ground. In such cases, the passive fundamental component 132 or the redundant passive fundamental component 136 may be coupled between the switch 612 or the switch 616, respectively, and the ground. This approach corresponds to the depiction in FIG. 7. In other cases, however, the first node 308-1 may be on a ground side or otherwise correspond to a ground, and the second node 308-2 may be on a supply voltage side or otherwise correspond to a voltage supply. In such cases, the passive fundamental component 132 or the redundant passive fundamental component 136 may be coupled between the switch 612 or the switch 616, respectively, and the voltage supply. This approach is described next with reference to FIG. 7.

Thus, in contrast with the illustration in FIG. 7, the switch 612-X may be coupled between the passive fundamental component 132-X and the ground. The Q factor can be improved using such a ground-side switch. To implement such an arrangement, the transistor 708 (which can provide a voltage refresh at the terminal 310 responsive to the reset signal "rst") can be coupled in parallel with the passive fundamental component 132-X. For instance, the transistor 708, which may function like a reset switch or a bypass switch, can be coupled in parallel with the passive fundamental component 132-X at the first and second terminals 310-1 and 310-2 thereof (e.g., of FIG. 3). Generally, the transistor 708 can be coupled in parallel with the passive fundamental component 132-X if one or more other components (e.g., instead of, or in addition to, the switch 612-X) is coupled between the passive fundamental component 132-X and the ground to enable a voltage level refresh to be provided at the terminal 310.

Two example schemes for repairing a circuit that includes at least one failed passive fundamental component are described herein. In these two schemes, fault detection circuitry 302 can determine that a passive fundamental component 132 has failed by detecting, e.g., a short-circuit or an open-circuit condition. The fault detection circuitry 302 can also establish a vector of values respectively indicating a pass/fail condition of individual passive fundamental components. In one of the two schemes, the fault tolerant circuitry 134 replaces a failed passive fundamental component 132 with an operational redundant passive fundamental component 136. To do so, the failed passive fundamental component 132 of a "main" array of passive fundamental components is disconnected from a node, and the operational redundant passive fundamental component 136 of a "redundant" array of such redundant components is connected to the node to replace the failed passive fundamental component 132. This scheme is described above, particularly with respect to FIG. 6.

In another of the two schemes, the fault tolerant circuitry 134 "discards" the failed passive fundamental component 132 without engaging or activating a replacement. In other words, the fault tolerant circuitry 134 can disconnect the failed passive fundamental component 132 from a node but omit connecting another component. If a sufficient quantity of passive fundamental components is used initially, then functionality can continue at or within a target performance level or range even with a passive fundamental component being discarded. This scheme is described below with reference to FIGS. 8-1 and 8-2.

Figures 1, 8:
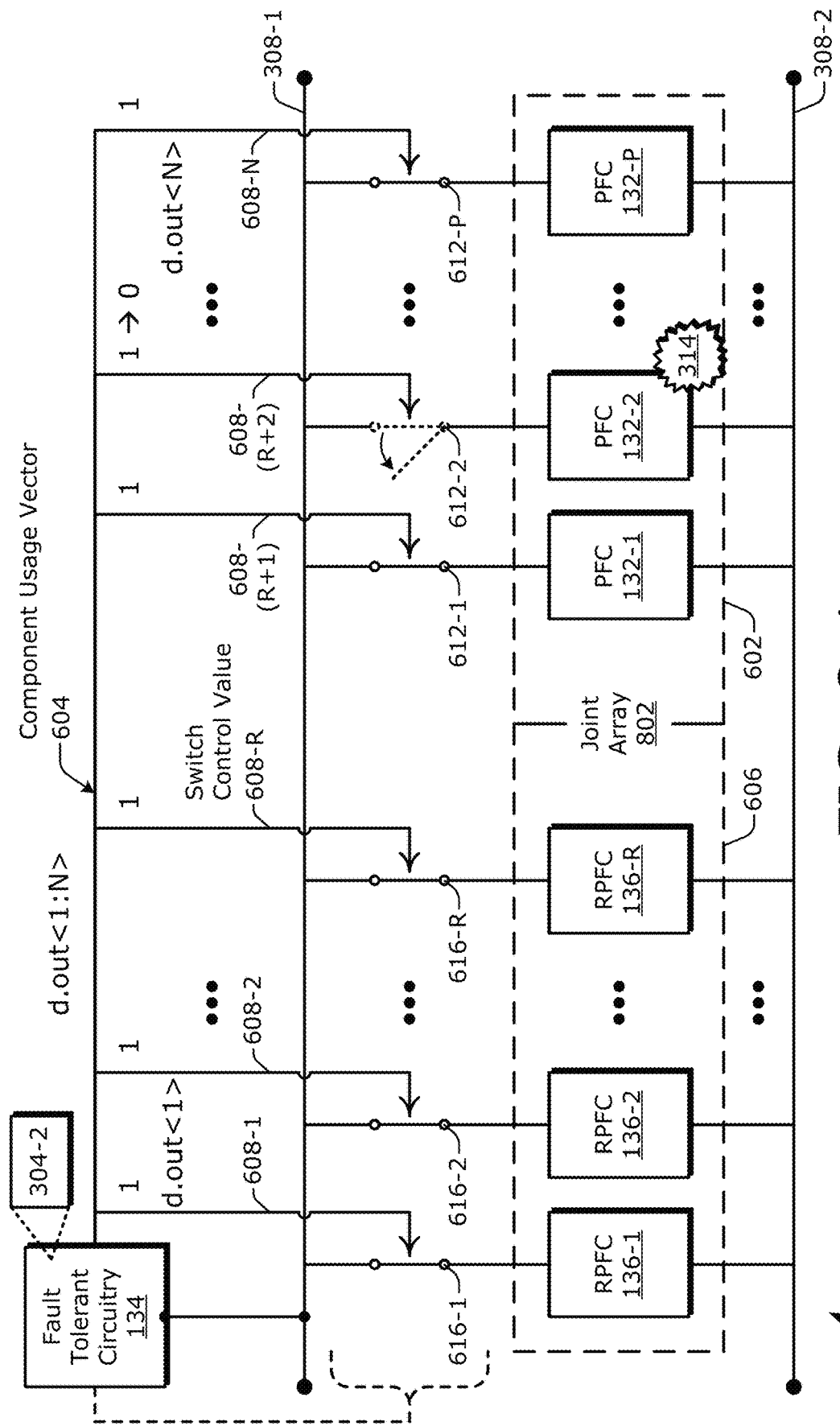
Figures 2, 8:
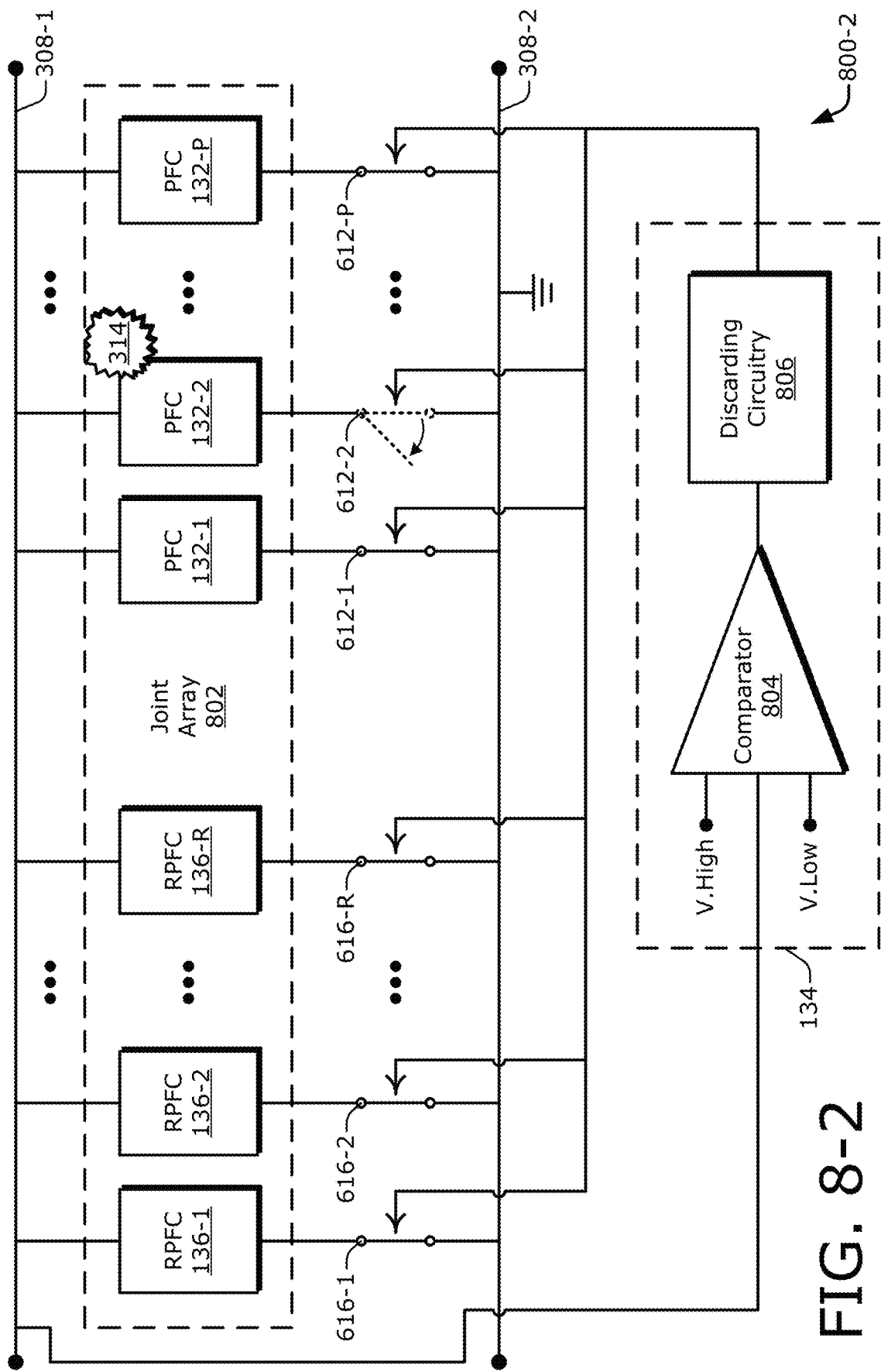

FIG. 8-1 is a circuit diagram 800-1 illustrating an example robust circuitry arrangement that includes an array 602 of passive fundamental components and an array 606 of redundant passive fundamental components in an example discarding scheme. In example implementations, the two arrays 602 and 606 can be conceptualized and/or realized as a combined or joint array 802. Initially, the multiple passive fundamental components 132-1 . . . 132-P and the multiple redundant passive fundamental components 136-1 . . . 136-R are respectively connected to a first node 308-1 via respective ones of the multiple switches 612-1 . . . 612-P and the multiple switches 616-1 . . . 616-R. If a fault 314 occurs at a passive fundamental component 132, such as at the second passive fundamental component 132-2, the corresponding switch 612, such as the second switch 612-2, is opened to disconnect the passive fundamental component 132 from the first node 308-1 by the component discarding circuitry 304-2. No redundant passive fundamental component 136 is connected or disconnected in this example discarding scheme in response to the disconnection of the faulty passive fundamental component 132.

In the illustrated example, the quantity "P+R" of passive fundamental components (both "regular" and "redundant") is sufficient to produce a "surplus condition" with respect to the impact made to the circuit by the passive fundamental components. The surplus condition means that the joint array 802 can "lose" a passive fundamental component 132 to a fault 314, yet the joint array 802 can continue to meet a target parameter. For instance, a joint array 802 of multiple passive fundamental components (including regular and redundant ones) may be designed to function within targeted specifications if the total value (e.g., the total capacitance, the total resistance, or the total inductance) is within +/−3% of a target value. The joint array 802 can therefore include 51 passive fundamental components 132 and/or 136 if each such passive fundamental component contributes 2% of the target value. If a passive fundamental component fails in such a scenario, the joint array 802 falls from 102% of the target value to 100% of the target value, which remains between the 97-103% range of the targeted specification. In this instance, the joint array 802 can also lose another passive fundamental component and still meet the targeted specification range at a 98% value level.

In these manners, the joint array 802 can continue to function within targeted specifications even if a passive fundamental component 132 is "discarded." As shown in FIG. 8-2, during operation the fault detection circuitry 302 (of the depicted fault tolerant circuitry 134) can detect the fault 314 of the second passive fundamental component 132-2. To "discard" the faulty component, the fault tolerant circuitry 134 opens the second switch 612-2 to disconnect the second passive fundamental component 132-2 from the first node 308-1 as indicated by the curved arrow and dashed switch lines.

For this discarding scheme, the joint array 802 is designed to continue to perform within a targeted specification using the "P+R−1" remaining passive fundamental components 132 and 136. More specifically, the joint array 802 can continue to perform within the targeted specification using the "P−1" remaining multiple passive fundamental components 132-1 . . . 132-P and the "R" remaining multiple redundant passive fundamental components 136-1 . . . 136-R. In this discarding context, the distinction between a passive fundamental component 132 and a redundant passive fundamental component 136 can be considered to dissolve or collapse as each passive fundamental component (whether "regular" or "redundant") of the joint array 802 can be faulty and can then be disconnected to discard it without another passive fundamental component being switched into service.

The fault tolerant circuitry 134 of FIGS. 3, 5, and 7 may be used in conjunction with the example discarding schemes of FIGS. 8-1 and 8-2—e.g., to detect a fault, establish or modify a component usage vector 604, and so forth. The example circuit diagram 800-1 is shown with the switches coupled between the passive fundamental components and the first node 308-1, which may comprise a ground, a voltage supply, a node at or through which a signal propagates, a node that is closer to the ground than is the passive fundamental components, a node that is closer to the voltage supply than is the passive fundamental components, and so forth. The circuit diagram 800-2, which is described next, shows an example in which the switches are implemented as ground-side switches.

FIG. 8-2 is a circuit diagram 800-2 illustrating another example robust circuitry arrangement that includes an array of passive fundamental components and redundant passive fundamental components in an example discarding scheme. In example implementations, the fault tolerant circuitry 134 includes at least one comparator 804 and discarding circuitry 806. The comparator 804 can be coupled to the first node 308-1. The discarding circuitry 806 can be coupled between an output of the comparator 804 and the multiple switches 612-1 . . . 612-P and 616-1 . . . 616-R.

In example operations, the comparator 804 receives a high-level voltage, a low-level voltage, and a voltage from the first node 308-1. Generally, the comparator 804 can determine if the voltage corresponding to the first node 308-1 is higher than the high voltage or lower than the low voltage (or between the low and high voltage levels). An indication of this comparison is provided to the discarding circuitry 806 via an output of the comparator 804. Based on this indication of the comparison, the discarding circuitry 806 can disconnect at least one passive fundamental component, as is described next.

As shown in FIG. 8-2, there are multiple passive fundamental components, both regular and "redundant," in the joint array 802. Each of these passive fundamental components can be active in operational/mission mode as long as no such components have failed. The at least one comparator 804, which can include two comparators—one for the high-level voltage and one for the low-level voltage, can check high and low voltage levels continuously. If there is a triggering event (e.g., the voltage level corresponding to the first node 308-1 drifts outside of a low-to-high voltage threshold range), the passive fundamental components can be scanned one by one (e.g., sequentially). Binary scanning or SAR-type scanning may be used. If a passive fundamental component has failed, the faulty passive fundamental component is disconnected from the second node 308-2 using a switch 612 or 616 without connecting another passive fundamental component 132 or 136 while maintaining functionality, as is described above with reference to FIG. 8-1.

The functionality of the joint array 802 of multiple passive fundamental components can be maintained by designing sufficient headroom or excess circuit impact (e.g., capacitance, resistance, or inductance) to permit at least one passive fundamental component to be removed without the joint array 802 departing from a permitted or targeted specification range. In the illustrated example of FIG. 8-2, respective switches are coupled between respective passive fundamental components and the ground to increase the Q factor. The monitoring and protection circuitry shown in the circuit diagram 800-2 can also be implemented with supply-side switches, however.

Figure 9:
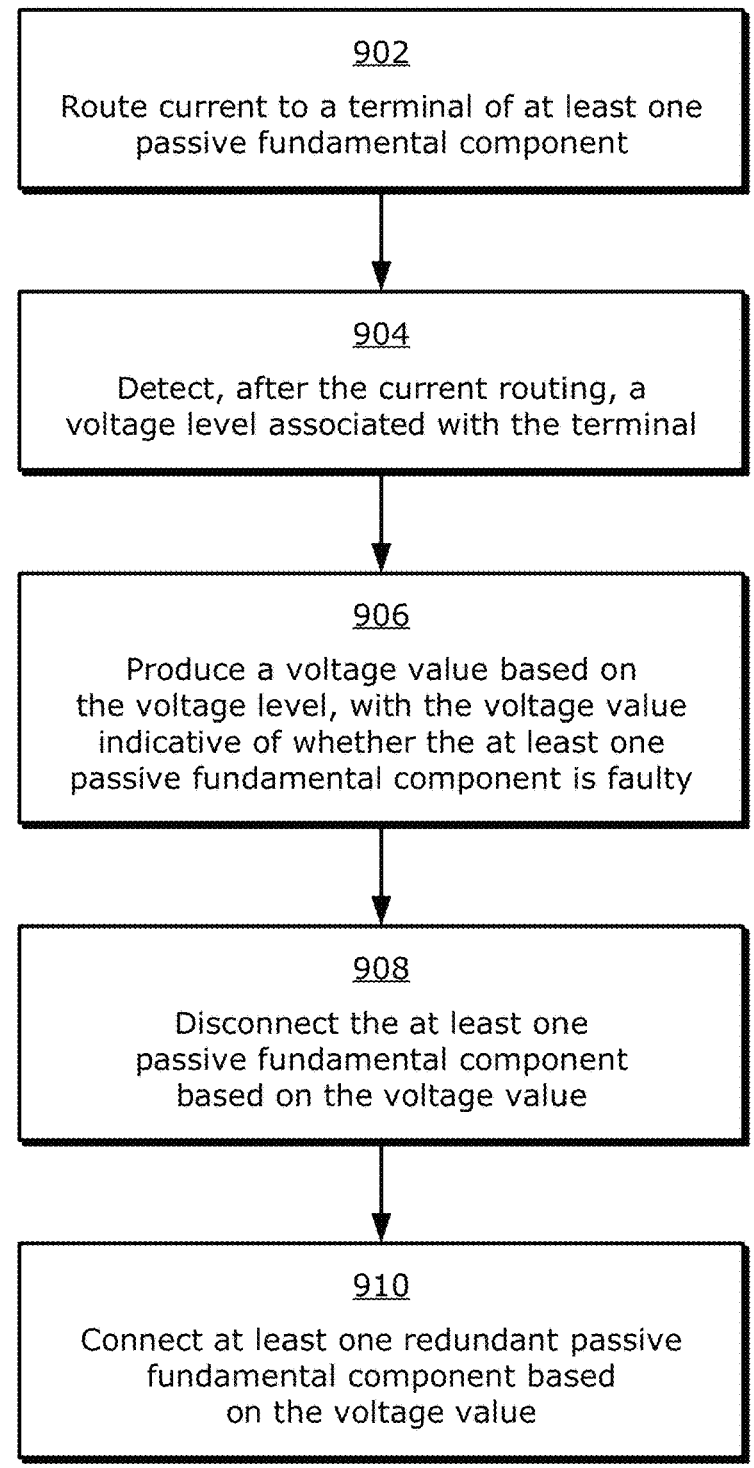
FIG. 9 is a flow diagram illustrating an example process for robustly operating circuitry with passive fundamental components.

FIG. 9 is a flow diagram illustrating an example process 900 for robustly operating circuitry with passive fundamental components and/or for increasing fault tolerance with passive fundamental components. The process 900 is described in the form of a set of blocks 902-910 that specify operations that can be performed. However, operations are not necessarily limited to the order shown in FIG. 9 or described herein, for the operations may be implemented in alternative orders or in fully or partially overlapping manners. Also, more, fewer, and/or different operations may be implemented to perform the process 900 or an alternative process. Operations represented by the illustrated blocks of the process 900 may be performed by an electronic device, such as the electronic device 102 of FIG. 1 or the wireless interface device 120 thereof. More specifically, the operations of the process 900 may be performed by fault tolerant circuitry 134 (e.g., of FIGS. 1, 3, and 5-7). The process 900 may be performed in a radio-frequency section 130 of the wireless interface device 120.

At block 902, fault tolerant circuitry 134 routes current to a terminal of at least one passive fundamental component. For example, a voltage creator 508 can route a current 716 to a terminal 310 of at least one passive fundamental component 132-x. For instance, a current provider 706 can direct the current 716 through a switch 612-x toward a node 502 to attempt to change a voltage level 320 corresponding to the node 502.

At block 904, the fault tolerant circuitry 134 detects, after the routing, a voltage level associated with the terminal. For example, a voltage monitor 510 can detect, after the current routing, the voltage level 320 that is associated with the terminal 310. The monitoring may be performed by a clocking input of a flip-flop 710. If there is no short-circuit condition of the passive fundamental component 132-x, the voltage level 320 may climb due to the current 716 being delivered to the terminal 310. In some cases, a voltage refresher 506 can refresh the voltage level 320 prior to the detecting.

At block 906, the fault tolerant circuitry 134 produces a voltage value based on the voltage level, with the voltage value indicative of whether the at least one passive fundamental component is faulty. For example, a voltage value indicator 512 can produce a voltage value 720-x based on the voltage level 320. The voltage value 720-x can be indicative of whether the passive fundamental component 132-x has a fault 314. To do so, a "Q" output of a DQ flip-flop may produce the voltage value 720-x based on a value tied to a "D" input of the DQ flip-flop and the voltage level 320 being coupled to the clocking input of the DQ flip-flop.

At block 908, the fault tolerant circuitry 134 disconnects the at least one passive fundamental component based on the voltage value. For example, component repair circuitry 304 can disconnect the passive fundamental component 132-x based on the voltage value 720-x. Here, the component repair circuitry 304 may couple a switch control value 608-x to a switch 612-x (not explicitly shown) to cause the switch 612-x to open and disconnect the passive fundamental component 132-x from a node 308-1.

At block 910, the fault tolerant circuitry 134 connects at least one redundant passive fundamental component based on the voltage value. For example, the component repair circuitry 304 can connect at least one redundant passive fundamental component 136-R based on the voltage value 720-x. To make the connection, the component repair circuitry 304 may couple a switch control value 608-R to a switch 616-R to cause the switch 616-R to close and connect the redundant passive fundamental component 136-R to the node 308-1. In some implementations, an encoder 704 accepts multiple voltage values 720-1 . . . 720-P as multiple fault indications d<1> . . . d<P> and maps them to at least one passive fundamental component 132 and at least one redundant passive fundamental component 136. Based on the mapping, the encoder 704 produces a component usage vector 604 having multiple switch control values 608-1 . . . 608-N that serve as data-out indication signals d.out<1> . . . d.out<N>.

This section describes some aspects of example implementations and/or example configurations related to the apparatuses and/or processes presented above.

Example aspect 1: An apparatus comprising:
at least one passive fundamental component;
at least one redundant passive fundamental component; and
fault tolerant circuitry coupled to the at least one passive fundamental component and the at least one redundant passive fundamental component, the fault tolerant circuitry comprising:
  fault detection circuitry configured to detect a fault of the at least one passive fundamental component; and
  component repair circuitry configured to disconnect the at least one passive fundamental component based on the fault.

Example aspect 2: The apparatus of example aspect 1, wherein the fault tolerant circuitry comprises:
  a switch coupled to the at least one passive fundamental component,
  wherein the component repair circuitry is configured to open the switch that is coupled to the at least one passive fundamental component based on the fault.

Example aspect 3: The apparatus of example aspect 1 or example aspect 2, wherein:
  the component repair circuitry is configured to connect the at least one redundant passive fundamental component based on the fault.

Example aspect 4: The apparatus of example aspect 3, wherein:
  the fault tolerant circuitry comprises another switch coupled to the at least one redundant passive fundamental component,
  wherein the component repair circuitry is configured to close the other switch that is coupled to the at least one redundant passive fundamental component based on the fault.

Example aspect 5: The apparatus of example aspect 4, wherein:
  the switch is coupled between the at least one passive fundamental component and a node; and
  the other switch is coupled between the at least one redundant passive fundamental component and the node,
  wherein the component repair circuitry is configured to open the switch to disconnect the at least one passive fundamental component from the node and to close the other switch to connect the at least one redundant passive fundamental component to the node.

Example aspect 6: The apparatus of example aspect 5, wherein the apparatus is configured to:
  propagate an alternating current (AC) signal through the node.

Example aspect 7: The apparatus of example aspect 4, wherein:
  the switch is coupled between the at least one passive fundamental component and a ground; and
  the other switch is coupled between the at least one redundant passive fundamental component and the ground,
  wherein the component repair circuitry is configured to open the switch to disconnect the at least one passive fundamental component from the ground and to close the other switch to connect the at least one redundant passive fundamental component to the ground.

Example aspect 8: The apparatus of any one of example aspects 2-7, wherein the fault tolerant circuitry comprises:
  a multiplexer comprising multiple inputs and an output, the output coupled to the switch and configured to control a state of the switch.

Example aspect 9: The apparatus of example aspect 8, wherein:
  the multiple inputs comprise a first input and a second input; and
  the fault tolerant circuitry is configured to provide a testing selection signal to the first input for a fault detection mode and a data-out indication signal to the second input for a mission mode.

Example aspect 10: The apparatus of any one of the preceding example aspects, wherein:
  the component repair circuitry is configured to connect the at least one redundant passive fundamental component based on the fault.

Example aspect 11: The apparatus of any one of the preceding example aspects, wherein the fault tolerant circuitry comprises:
  a flip-flop coupled to a terminal of the at least one passive fundamental component, the flip-flop configured to change an output voltage value of the flip-flop based on a voltage level at the terminal of the at least one passive fundamental component.

Example aspect 12: The apparatus of example aspect 11, wherein the fault tolerant circuitry comprises:
  a transistor coupled to the terminal of the at least one passive fundamental component, the transistor configured to refresh the voltage level at the terminal of the at least one passive fundamental component.

Example aspect 13: The apparatus of example aspect 12, wherein:
  the flip-flop comprises a DQ flip-flop comprising a reset terminal; and
  fault tolerant circuitry is configured to provide a reset signal to a control terminal of the transistor and the reset terminal of the DQ flip-flop.

Example aspect 14: The apparatus of any one of example aspects 11-13, wherein the fault tolerant circuitry comprises:
  a current provider configured to route current to the terminal of the at least one passive fundamental component.

Example aspect 15: The apparatus of any one of example aspects 11-14, wherein the component repair circuitry is configured to:
  use the output voltage value of the flip-flop to determine whether to disconnect the at least one passive fundamental component and to connect the at least one redundant passive fundamental component.

Example aspect 16: The apparatus of any one of the preceding example aspects, wherein the fault tolerant circuitry comprises:
  protection circuitry coupled to the fault detection circuitry,
  wherein the fault detection circuitry is configured to activate the protection circuitry responsive to detection of a recursive event.

Example aspect 17: The apparatus of any one of the preceding example aspects, wherein:
  the at least one passive fundamental component comprises at least one radio-frequency component; and
  the at least one redundant passive fundamental component comprises at least one redundant radio-frequency component.

Example aspect 18: The apparatus of example aspect 17, wherein:
  the apparatus comprises an electronic device comprising a radio-frequency section;
  the at least one radio-frequency component comprises a part of the radio-frequency section; and the at least one redundant radio-frequency component comprises part of the radio-frequency section.

Example aspect 19: The apparatus of any one of the preceding example aspects, wherein:
the at least one passive fundamental component comprises at least one resistor; and
the at least one redundant passive fundamental component comprises at least one redundant resistor.

Example aspect 20: The apparatus of any one of the preceding example aspects, wherein:
the at least one passive fundamental component comprises at least one inductor; and
the at least one redundant passive fundamental component comprises at least one redundant inductor.

Example aspect 21: The apparatus of any one of the preceding example aspects, wherein:
the at least one passive fundamental component comprises at least one capacitor; and
the at least one redundant passive fundamental component comprises at least one redundant capacitor.

Example aspect 22: The apparatus of example aspect 21, wherein:
the at least one capacitor comprises at least one coupling capacitor; and
the at least one redundant capacitor comprises at least one redundant coupling capacitor.

Example aspect 23: The apparatus of example aspect 21, wherein:
the at least one capacitor comprises at least one filter capacitor; and
the at least one redundant capacitor comprises at least one redundant filter capacitor.

Example aspect 24: The apparatus of any one of the preceding example aspects, further comprising:
a phase-locked loop,
wherein the phase-locked loop comprises the at least one passive fundamental component and the at least one redundant passive fundamental component.

Example aspect 25: The apparatus of any one of the preceding example aspects, wherein:
the fault comprises an open-circuit condition; and
the fault detection circuitry is configured to detect the open-circuit condition of the at least one passive fundamental component.

Example aspect 26: The apparatus of any one of the preceding example aspects, wherein:
the fault comprises a short-circuit condition; and
the fault detection circuitry is configured to detect the short-circuit condition across the at least one passive fundamental component.

Example aspect 27: The apparatus of any one of the preceding example aspects, wherein:
the at least one passive fundamental component comprises an array of passive fundamental components; and
the at least one redundant passive fundamental component comprises an array of redundant passive fundamental components.

Example aspect 28: The apparatus of example aspect 27, wherein:
a passive fundamental component of the array of passive fundamental components has a parameter value; and
a redundant passive fundamental component of the array of redundant passive fundamental components has another parameter value that is substantially equal to the parameter value of the passive fundamental component.

Example aspect 29: The apparatus of any one of the preceding example aspects, further comprising:
a wireless interface device,
wherein the wireless interface device comprises the at least one passive fundamental component, the at least one redundant passive fundamental component, and the fault tolerant circuitry.

Example aspect 30: The apparatus of example aspect 29, wherein:
the wireless interface device comprises at least one radio-frequency component that is configured to operate at a radio frequency; and
the at least one radio-frequency component comprises the at least one passive fundamental component and the at least one redundant passive fundamental component.

Example aspect 31: An apparatus for increasing fault tolerance with passive fundamental components, the apparatus comprising:
at least one passive fundamental component;
at least one redundant passive fundamental component;
detection means for detecting a fault of the at least one passive fundamental component; and
repair means for repairing the at least one passive fundamental component with the at least one redundant passive fundamental component based on the fault.

Example aspect 32: The apparatus of example aspect 31, further comprising:
means for detecting a voltage level associated with the at least one passive fundamental component during a fault detection operation.

Example aspect 33: The apparatus of example aspect 32, further comprising:
means for refreshing the voltage level for the fault detection operation.

Example aspect 34: A method for increasing fault tolerance with passive fundamental components, the method comprising:
routing current to a terminal of at least one passive fundamental component;
detecting, after the routing, a voltage level associated with the terminal;
producing a voltage value based on the voltage level, the voltage value indicative of whether the at least one passive fundamental component is faulty;
disconnecting the at least one passive fundamental component based on the voltage value; and
connecting at least one redundant passive fundamental component based on the voltage value.

Example aspect 35: The method of example aspect 34, further comprising:
refreshing the voltage level prior to the detecting; and
resetting a flip-flop prior to the detecting.

Example aspect 36: The method of example aspect 34 or example aspect 35, further comprising:
encoding multiple voltage values into a component usage vector, the multiple voltage values including the voltage value that is based on the voltage level;
coupling the component usage vector to multiple multiplexers; and
controlling a state of respective switches of multiple switches using respective multiplexers of the multiple multiplexers responsive to the component usage vector, a switch of the multiple switches configured to selectively connect or disconnect the at least one passive fundamental component.

Example aspect 37: An apparatus for robust circuitry with passive fundamental components, the apparatus comprising:

at least one radio-frequency component comprising:
an array of passive fundamental components;
an array of redundant passive fundamental components; and fault tolerant circuitry comprising:
multiple switches, each respective switch of the multiple switches coupled between:
a node; and
a terminal of a respective passive fundamental component of the array of passive fundamental components or a terminal of a respective redundant passive fundamental component of the array of redundant passive fundamental components;
multiple flip-flops, each respective flip-flop of the multiple flip-flops coupled to the terminal of a respective passive fundamental component of the array of passive fundamental components; and
multiple multiplexers, each respective multiplexer of the multiple multiplexers coupled between a respective flip-flop of the multiple flip-flops and a respective switch of the multiple switches that are coupled between the node and the terminal of a respective passive fundamental component of the array of passive fundamental components.

As used herein, "couple," "coupled," or "coupling" refers to a relationship between two or more components that are in operative communication magnetically, electromagnetically, or by being electrically connected to implement some feature or realize some capability that is described. The term "connect," "connected," or "connecting" refers to an electrical connection using a physical line, such as a metal trace or wire. In some cases, an electrical connection can include a resistor, a capacitor, an inductor, a transistor, and so forth. A connection can include a direct connection or an indirect connection. A direct connection refers to connecting discrete circuit elements via a same node without an intervening element. An indirect connection refers to connecting discrete circuit elements via one or more other devices or other discrete circuit elements.

The terms "first," "second," "third," and other numeric-related indicators or differentiators are used herein to identify or distinguish similar or analogous items from one another within a given context. Here, such contexts can include a particular implementation, a given component, a single drawing figure or a group of related drawing figures, or a claim. Thus, a first item in one context may be the same as or may differ from a first item in another context. For example, an item identified as a "first passive fundamental component" or a "first switch" in one context may be identified for clarity purposes as a "second passive fundamental component" or a "third switch," respectively, in another context. Although various items and components that are illustrated in the drawings may be coupled together using single lines, the connecting lines and the associated items and components may operate with differential signaling or single-ended signaling.

The term "node" represents at least a point of electrical connection between two or more components (e.g., active or passive circuit elements). Although at times a node may be visually depicted in a drawing as a single point, the node can represent a connected portion of a physical circuit or network that has at least approximately a same voltage potential between two or more components. In other words, a node can represent at least one of multiple points along a conducting medium (e.g., a wire or trace) that exists between electrically connected components.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one" of a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
a radio-frequency front-end comprising:
at least one passive fundamental component comprising at least one radio-frequency component of a wireless interface device; and
at least one redundant passive fundamental component comprising at least one redundant radio-frequency component of the wireless interface device; and
fault tolerant circuitry coupled to the at least one passive fundamental component and the at least one redundant passive fundamental component, the fault tolerant circuitry comprising:
fault detection circuitry configured to detect a fault of the at least one passive fundamental component; and
component repair circuitry configured to disconnect the at least one passive fundamental component based on the fault.

2. The apparatus of claim 1, wherein the fault tolerant circuitry comprises:
a switch coupled to the at least one passive fundamental component,
wherein the component repair circuitry is configured to open the switch that is coupled to the at least one passive fundamental component based on the fault.

3. The apparatus of claim 2, wherein:
the component repair circuitry is configured to connect the at least one redundant passive fundamental component based on the fault.

4. The apparatus of claim 3, wherein:
the fault tolerant circuitry comprises another switch coupled to the at least one redundant passive fundamental component,
wherein the component repair circuitry is configured to close the other switch that is coupled to the at least one redundant passive fundamental component based on the fault.

5. The apparatus of claim 4, wherein:
the switch is coupled between the at least one passive fundamental component and a node; and the other switch is coupled between the at least one redundant passive fundamental component and the node, wherein the component repair circuitry is configured to open the switch to disconnect the at least one passive fundamental component from the node and to close the other switch to connect the at least one redundant passive fundamental component to the node.

6. The apparatus of claim 5, wherein the apparatus is configured to:

propagate an alternating current (AC) signal through the node.

7. The apparatus of claim 4, wherein:

the switch is coupled between the at least one passive fundamental component and a ground; and the other switch is coupled between the at least one redundant passive fundamental component and the ground, wherein the component repair circuitry is configured to open the switch to disconnect the at least one passive fundamental component from the ground and to close the other switch to connect the at least one redundant passive fundamental component to the ground.

8. The apparatus of claim 2, wherein the fault tolerant circuitry comprises:

a multiplexer comprising multiple inputs and an output, the output coupled to the switch and configured to control a state of the switch.

9. The apparatus of claim 8, wherein:

the multiple inputs comprise a first input and a second input; and the fault tolerant circuitry is configured to provide a testing selection signal to the first input for a fault detection mode and a data-out indication signal to the second input for a mission mode.

10. The apparatus of claim 1, wherein the fault tolerant circuitry comprises:

a flip-flop coupled to a terminal of the at least one passive fundamental component, the flip-flop configured to change an output voltage value of the flip-flop based on a voltage level at the terminal of the at least one passive fundamental component.

11. The apparatus of claim 10, wherein the fault tolerant circuitry comprises:

a transistor coupled to the terminal of the at least one passive fundamental component, the transistor configured to refresh the voltage level at the terminal of the at least one passive fundamental component.

12. The apparatus of claim 10, wherein the fault tolerant circuitry comprises:

a current provider configured to route current to the terminal of the at least one passive fundamental component.

13. The apparatus of claim 10, wherein the component repair circuitry is configured to:

use the output voltage value of the flip-flop to determine whether to disconnect the at least one passive fundamental component and to connect the at least one redundant passive fundamental component.

14. The apparatus of claim 1, wherein the fault tolerant circuitry comprises:

protection circuitry coupled to the fault detection circuitry, wherein the fault detection circuitry is configured to activate the protection circuitry responsive to detection of a recursive event.

15. The apparatus of claim 1, wherein:

the apparatus comprises an electronic device comprising a radio-frequency section;

the at least one radio-frequency component comprises a part of the radio-frequency section; and the at least one redundant radio-frequency component comprises part of the radio-frequency section.

16. The apparatus of claim 1, wherein:

the at least one passive fundamental component comprises at least one resistor; and the at least one redundant passive fundamental component comprises at least one redundant resistor.

17. The apparatus of claim 1, wherein:

the at least one passive fundamental component comprises at least one inductor; and the at least one redundant passive fundamental component comprises at least one redundant inductor.

18. The apparatus of claim 1, wherein:

the at least one passive fundamental component comprises at least one capacitor; and the at least one redundant passive fundamental component comprises at least one redundant capacitor.

19. The apparatus of claim 1, further comprising:

a phase-locked loop, wherein the phase-locked loop comprises the at least one passive fundamental component and the at least one redundant passive fundamental component.

20. The apparatus of claim 1, wherein:

the at least one passive fundamental component comprises an array of passive fundamental components; and the at least one redundant passive fundamental component comprises an array of redundant passive fundamental components.

21. The apparatus of claim 20, wherein:

a passive fundamental component of the array of passive fundamental components has a parameter value; and a redundant passive fundamental component of the array of redundant passive fundamental components has another parameter value that is substantially equal to the parameter value of the passive fundamental component.

22. The apparatus of claim 1, further comprising:

the wireless interface device, wherein the wireless interface device comprises the radio-frequency front-end and the fault tolerant circuitry.

23. The apparatus of claim 22, wherein:

the at least one radio-frequency component is configured to operate at a radio frequency in a radio-frequency section of the wireless interface device; and the at least one redundant radio-frequency component is configured to operate at a radio frequency in the radio-frequency section of the wireless interface device.

24. A method for increasing fault tolerance with passive fundamental components, the method comprising:

routing current to a terminal of at least one passive fundamental component;

refreshing a voltage level associated with the terminal;

resetting a flip-flop coupled to the terminal;

detecting the voltage level associated with the terminal after the routing, the refreshing, and the resetting;

producing a voltage value based on the voltage level, the voltage value indicative of whether the at least one passive fundamental component is faulty;

disconnecting the at least one passive fundamental component based on the voltage value; and connecting at least one redundant passive fundamental component based on the voltage value.

25. The method of claim 24, further comprising:
encoding multiple voltage values into a component usage vector, the multiple voltage values including the voltage value that is based on the voltage level;
coupling the component usage vector to multiple multiplexers; and
controlling a state of respective switches of multiple switches using respective multiplexers of the multiple multiplexers responsive to the component usage vector, a switch of the multiple switches configured to selectively connect or disconnect the at least one passive fundamental component.

26. An apparatus comprising:
at least one passive fundamental component comprising at least one inductor;
at least one redundant passive fundamental component comprising at least one redundant inductor; and
fault tolerant circuitry coupled to the at least one inductor and the at least one redundant inductor, the fault tolerant circuitry comprising:
fault detection circuitry configured to detect a fault of the at least one inductor; and
component repair circuitry configured to disconnect the at least one inductor based on the fault.

27. The apparatus of claim 26, wherein:
the at least one inductor comprises at least one radio-frequency component of a wireless interface device; and
the at least one redundant inductor comprises at least one redundant radio-frequency component of the wireless interface device.

28. An apparatus comprising:
a phase-locked loop comprising:
at least one passive fundamental component; and
at least one redundant passive fundamental component; and
fault tolerant circuitry coupled to the at least one passive fundamental component and the at least one redundant passive fundamental component, the fault tolerant circuitry comprising:
fault detection circuitry configured to detect a fault of the at least one passive fundamental component; and
component repair circuitry configured to disconnect the at least one passive fundamental component based on the fault.

29. The apparatus of claim 28, wherein:
the fault tolerant circuitry comprises:
a switch coupled to the at least one passive fundamental component; and
a multiplexer comprising multiple inputs and an output, the output coupled to the switch and configured to control a state of the switch; and
the component repair circuitry is configured to open the switch that is coupled to the at least one passive fundamental component based on the fault and using the multiplexer.

30. The apparatus of claim 28, wherein the fault tolerant circuitry comprises:
a flip-flop coupled to a terminal of the at least one passive fundamental component, the flip-flop configured to change an output voltage value of the flip-flop based on a voltage level at the terminal of the at least one passive fundamental component.

31. An apparatus comprising:
at least one passive fundamental component;
at least one redundant passive fundamental component; and
fault tolerant circuitry coupled to the at least one passive fundamental component and the at least one redundant passive fundamental component, the fault tolerant circuitry comprising:
fault detection circuitry configured to detect a fault of the at least one passive fundamental component;
component repair circuitry configured to disconnect the at least one passive fundamental component based on the fault; and
a flip-flop coupled to a terminal of the at least one passive fundamental component, the flip-flop configured to change an output voltage value of the flip-flop based on a voltage level at the terminal of the at least one passive fundamental component.

* * * * *